(12) United States Patent
Kinoshita et al.

(10) Patent No.: US 11,003,052 B2
(45) Date of Patent: May 11, 2021

(54) MOBILE DEVICE

(71) Applicant: CITIZEN ELECTRONICS CO., LTD., Fujiyoshida (JP)

(72) Inventors: Jo Kinoshita, Fujiyoshida (JP); Yuki Suto, Fujiyoshida (JP); Munetaka Itami, Fujiyoshida (JP); Kouichi Fukasawa, Fujiyoshida (JP); Makoto Arai, Fujiyoshida (JP)

(73) Assignee: CITIZEN ELECTRONICS CO., LTD., Fujiyoshida (JP)

( * ) Notice: Subject to any disclaimer, the term of this patent is extended or adjusted under 35 U.S.C. 154(b) by 155 days.

(21) Appl. No.: 16/342,484

(22) PCT Filed: Oct. 17, 2017

(86) PCT No.: PCT/JP2017/037585
§ 371 (c)(1),
(2) Date: Apr. 16, 2019

(87) PCT Pub. No.: WO2018/074484
PCT Pub. Date: Apr. 26, 2018

(65) Prior Publication Data
US 2019/0243215 A1 Aug. 8, 2019

(30) Foreign Application Priority Data

Oct. 17, 2016 (JP) .............................. JP2016-203363
Apr. 7, 2017 (JP) .............................. JP2017-076830

(51) Int. Cl.
*G03B 15/05* (2021.01)
*H01L 33/50* (2010.01)
(Continued)

(52) U.S. Cl.
CPC ............. *G03B 15/05* (2013.01); *G03B 15/02* (2013.01); *H01L 33/50* (2013.01); *H04N 9/07* (2013.01);
(Continued)

(58) Field of Classification Search
CPC .................... G03B 15/05; G03B 15/02; G03B 2215/0567; G03B 2215/0503; H01L 33/50; H04N 9/07
See application file for complete search history.

(56) References Cited

U.S. PATENT DOCUMENTS 9,526,143 B1 * 12/2016 Petluri ................... H05B 45/48
2014/0183578 A1 7/2014 Horie
(Continued)

FOREIGN PATENT DOCUMENTS

JP 2000-278707 A 10/2000
JP 2008-185816 A 8/2008
(Continued)

OTHER PUBLICATIONS

International Search Report dated Dec. 12, 2017 in PCT/JP2017/037585 filed on Oct. 17, 2017.
(Continued)

*Primary Examiner* — Renan Luque
(74) *Attorney, Agent, or Firm* — Oblon, McClelland, Maier & Neustadt, L.L.P.

(57) ABSTRACT

A mobile device including: at least an imaging element; and a light-emitting device that irradiates a subject in accordance with imaging of the imaging element, in which the light-emitting device includes a semiconductor light-emitting element, and the difference of the normalized spectral power distribution at a wavelength of 580 nm and a value B representing a difference between normalized spectral power distributions in a wavelength range from 540 nm to
(Continued)

610 nm and a wavelength range from 610 nm to 680 nm are appropriate values. By providing a wavelength control element, it is possible to improve the color reproducibility and the like of a captured image. The mobile device achieves both sensitivity improvement and color reproducibility in a trade-off relationship.

9 Claims, 33 Drawing Sheets
(5 of 33 Drawing Sheet(s) Filed in Color)

(51) Int. Cl.
    *H04N 9/07*         (2006.01)
    *G03B 15/02*       (2021.01)

(52) U.S. Cl.
    CPC ............... *G03B 2215/0503* (2013.01); *G03B 2215/0567* (2013.01)

(56) References Cited

U.S. PATENT DOCUMENTS

| | | | |
|---|---|---|---|
| 2014/0217417 A1* | 8/2014 | Horie | H01L 33/50 257/76 |
| 2015/0380460 A1 | 12/2015 | Horie | |
| 2016/0308097 A1* | 10/2016 | Horie | C09K 11/7769 |
| 2016/0334278 A1* | 11/2016 | Rector | G01J 3/505 |
| 2017/0233649 A1* | 8/2017 | Vick | C09K 11/64 313/503 |
| 2018/0130928 A1* | 5/2018 | Vick | C09K 11/64 |
| 2019/0041699 A1* | 2/2019 | David | G02F 1/133617 |

FOREIGN PATENT DOCUMENTS

| | | |
|---|---|---|
| JP | 2009-210837 A | 9/2009 |
| JP | 2014-197536 A | 10/2014 |
| JP | 2015-144231 A | 8/2015 |
| JP | 2016-54184 A | 4/2016 |
| WO | WO 2013/031942 A1 | 3/2013 |
| WO | WO 2013/031943 A1 | 3/2013 |
| WO | WO 2015/099115 A1 | 7/2015 |

OTHER PUBLICATIONS

Wood, M., "Television Lighting Consistency Index—TLCI," PROTOCOL, vol. 18, No. 4, 2013, pp. 24-28 (6 total pages).

* cited by examiner

Test light source A

| Filter | None | a | a+ | b | c | d | e | f |
|---|---|---|---|---|---|---|---|---|
| CCT: | 4422 | 4076 | 3582 | 4268 | 4789 | 3556 | 5366 | 4757 |
| Duv: | 0.005 | 0.000 | -0.003 | 0.013 | 0.000 | -0.001 | 0.008 | 0.004 |
| CRI Ra: | 84.4 | 95.7 | 95.7 | 93.4 | 97.5 | 94.6 | 94.2 | 93.5 |
| $\Delta C^*ab$ | -1.844 | 0.093 | 0.429 | -1.745 | 0.170 | 0.040 | -0.574 | 0.065 |
| $\Delta Cmax$ | 2.04 | 1.77 | 2.62 | 0.49 | 2.06 | 2.10 | 1.41 | 3.76 |
| $\Delta Cmin$ | -8.76 | -2.70 | -2.71 | -4.18 | -1.78 | -3.60 | -3.43 | -2.77 |
| $\Delta Cmax-min$ | 10.80 | 4.47 | 5.33 | 4.67 | 3.84 | 5.71 | 4.84 | 6.53 |
| $\Delta hmax$ | 8.23 | 3.14 | 3.50 | 1.79 | 2.85 | 4.40 | 2.70 | 3.90 |
| $\Delta hmin$ | 0.12 | 0.01 | 0.08 | 0.19 | 0.03 | 0.11 | 0.03 | 0.73 |
| B | 167.0 | 49.8 | 65.6 | 54.9 | 30.6 | 80.8 | 55.0 | 47.8 |
| $\Delta S(580)$ | -0.586 | -0.187 | -0.192 | 0.123 | -0.073 | -0.277 | 0.001 | 0.730 |
| $\Delta C_1$ | -2.35 | -0.74 | -0.55 | -2.74 | -1.27 | -0.83 | -1.49 | -2.77 |
| $\Delta C_2$ | 1.95 | 1.70 | 2.09 | -0.64 | 1.04 | 2.00 | 1.01 | -0.57 |
| $\Delta C_3$ | 2.04 | 1.64 | 1.71 | 0.49 | 2.06 | 1.44 | 1.41 | 0.41 |
| $\Delta C_4$ | -1.42 | -0.38 | -0.42 | -0.28 | 0.16 | -0.58 | -0.48 | 1.20 |
| $\Delta C_5$ | -3.55 | -0.79 | -0.93 | -0.54 | -0.19 | -1.12 | -0.89 | 2.49 |
| $\Delta C_6$ | -3.83 | 0.12 | 0.02 | -0.61 | 0.51 | -0.20 | -0.30 | 3.76 |
| $\Delta C_7$ | -2.67 | 1.48 | 1.77 | -0.91 | 1.58 | 1.34 | 0.47 | 3.42 |
| $\Delta C_8$ | 0.33 | 1.77 | 2.62 | -2.21 | 1.31 | 2.10 | 0.52 | -0.24 |
| $\Delta C_9$ | 1.41 | 1.03 | 2.02 | -3.10 | 0.34 | 1.57 | -0.07 | -2.31 |
| $\Delta C_{10}$ | 0.95 | 0.96 | 2.22 | -4.18 | 0.31 | 1.66 | -0.35 | -2.23 |
| $\Delta C_{11}$ | -0.40 | 0.02 | 0.75 | -2.91 | -0.05 | 0.33 | -0.72 | -1.04 |
| $\Delta C_{12}$ | -1.40 | -0.08 | 0.40 | -1.89 | 0.08 | 0.10 | -0.68 | 0.53 |
| $\Delta C_{13}$ | -2.92 | -0.36 | -0.11 | -1.01 | 0.09 | -0.45 | -0.83 | 1.88 |
| $\Delta C_{14}$ | -8.76 | -2.70 | -2.71 | -3.01 | -1.78 | -3.60 | -3.43 | -1.50 |
| $\Delta C_{15}$ | -7.05 | -2.26 | -2.44 | -2.62 | -1.64 | -3.16 | -2.79 | -2.06 |

Fig.11

| Filter | None | a | a+ | b | c | d | e | f |
|---|---|---|---|---|---|---|---|---|
| CCT: | 4091 | 3580 | 3175 | 3785 | 4209 | 3149 | 4796 | 4277 |
| Duv: | -0.003 | -0.008 | -0.009 | 0.004 | -0.010 | -0.008 | -0.002 | -0.007 |
| CRI Ra: | 83.7 | 95.2 | 95.2 | 94.3 | 95.1 | 94.6 | 95.0 | 92.7 |
| $\Delta C^*ab$ | -0.467 | 1.606 | 2.037 | -0.168 | 1.851 | 1.758 | 0.743 | 1.625 |
| $\Delta Cmax$ | 5.05 | 5.59 | 7.21 | 1.69 | 5.10 | 6.79 | 3.31 | 5.65 |
| $\Delta Cmin$ | -7.70 | -1.95 | -2.14 | -1.65 | -0.92 | -2.20 | -1.57 | -0.76 |
| $\Delta Cmax-min$ | 12.75 | 7.54 | 9.35 | 3.34 | 6.02 | 8.99 | 4.88 | 6.41 |
| $\Delta hmax$ | 9.19 | 5.97 | 5.79 | 3.64 | 5.95 | 5.49 | 5.73 | 3.10 |
| $\Delta hmin$ | 0.28 | 0.42 | 0.74 | 0.00 | 0.24 | 0.48 | 0.05 | 0.32 |
| B | 154.9 | 19.9 | 37.3 | 24.8 | -13.6 | 48.8 | 10.5 | 22.3 |
| $\Delta S(580)$ | -0.664 | -0.195 | -0.210 | 0.048 | -0.064 | -0.280 | -0.017 | 0.673 |
| $\Delta C_1$ | -0.05 | 1.52 | 1.52 | -0.29 | 1.42 | 1.23 | 0.29 | -0.43 |
| $\Delta C_2$ | 4.14 | 3.80 | 4.19 | 1.59 | 3.25 | 4.05 | 2.51 | 1.71 |
| $\Delta C_3$ | 3.16 | 2.48 | 2.56 | 1.58 | 3.01 | 2.41 | 3.06 | 1.82 |
| $\Delta C_4$ | -2.17 | -1.13 | -1.10 | -0.88 | -0.45 | -1.12 | -0.62 | 0.56 |
| $\Delta C_5$ | -4.92 | -1.95 | -2.14 | -1.49 | -0.92 | -2.20 | -1.57 | 1.49 |
| $\Delta C_6$ | -4.49 | -0.39 | -0.76 | -0.79 | 0.83 | -0.91 | -0.48 | 3.71 |
| $\Delta C_7$ | -1.01 | 3.19 | 3.28 | 1.12 | 4.03 | 2.93 | 2.14 | 5.65 |
| $\Delta C_8$ | 4.02 | 5.59 | 6.62 | 1.69 | 5.10 | 6.20 | 3.31 | 3.68 |
| $\Delta C_9$ | 5.05 | 4.89 | 6.19 | 0.66 | 3.88 | 5.80 | 2.44 | 1.49 |
| $\Delta C_{10}$ | 4.84 | 5.34 | 7.21 | -0.12 | 4.11 | 6.79 | 2.05 | 1.80 |
| $\Delta C_{11}$ | 1.30 | 2.16 | 3.45 | -1.11 | 1.66 | 3.18 | 0.32 | 0.69 |
| $\Delta C_{12}$ | -0.57 | 1.08 | 1.96 | -0.97 | 1.01 | 1.81 | -0.15 | 1.30 |
| $\Delta C_{13}$ | -2.73 | 0.08 | 0.57 | -0.70 | 0.58 | 0.38 | -0.35 | 2.01 |
| $\Delta C_{14}$ | -7.70 | -1.50 | -1.54 | -1.65 | 0.03 | -2.18 | -1.14 | -0.34 |
| $\Delta C_{15}$ | -5.88 | -1.07 | -1.45 | -1.16 | 0.23 | -1.98 | -0.67 | -0.76 |

Fig.13

| Filter | None | a | a+ | b | c | d | e | f |
|---|---|---|---|---|---|---|---|---|
| CCT: | 3774 | 3381 | 3069 | 3666 | 3833 | 3024 | 4388 | 3893 |
| Duv: | 0.002 | -0.002 | -0.004 | 0.008 | -0.003 | -0.003 | 0.004 | -0.001 |
| CRI Ra: | 82.8 | 92.8 | 94.1 | 93.3 | 96.2 | 93.0 | 93.5 | 92.5 |
| $\Delta C^*ab$ | -1.685 | 0.128 | 0.743 | -1.478 | 0.525 | 0.356 | -0.579 | 0.502 |
| $\Delta Cmax$ | 2.67 | 2.89 | 4.22 | 0.98 | 2.61 | 3.61 | 1.69 | 4.23 |
| $\Delta Cmin$ | -9.19 | -4.15 | -3.32 | -3.38 | -2.56 | -4.15 | -3.59 | -2.48 |
| $\Delta Cmax\text{-}min$ | 11.87 | 7.03 | 7.54 | 4.36 | 5.17 | 7.75 | 5.28 | 6.71 |
| $\Delta hmax$ | 9.95 | 5.42 | 5.61 | 2.34 | 3.30 | 6.59 | 3.25 | 3.98 |
| $\Delta hmin$ | 0.32 | 0.14 | 0.11 | 0.10 | 0.09 | 0.07 | 0.00 | 0.41 |
| B | 192.8 | 92.1 | 90.4 | 69.0 | 51.2 | 106.3 | 65.1 | 67.1 |
| $\Delta S(580)$ | -0.743 | -0.373 | -0.287 | -0.076 | -0.164 | -0.378 | -0.127 | 0.678 |
| $\Delta C_1$ | -1.86 | -0.52 | -0.20 | -2.22 | -0.39 | -0.45 | -1.46 | -1.99 |
| $\Delta C_2$ | 2.67 | 2.57 | 2.93 | 0.07 | 2.08 | 2.83 | 1.26 | 0.45 |
| $\Delta C_3$ | 1.89 | 1.66 | 1.70 | 0.98 | 1.70 | 1.36 | 1.69 | 0.61 |
| $\Delta C_4$ | -1.90 | -0.92 | -0.77 | -0.47 | -0.34 | -0.94 | -0.55 | 1.01 |
| $\Delta C_5$ | -4.19 | -1.88 | -1.63 | -1.09 | -0.68 | -1.79 | -1.28 | 2.13 |
| $\Delta C_6$ | -4.38 | -1.10 | -0.71 | -1.09 | 0.47 | -0.88 | -0.81 | 3.90 |
| $\Delta C_7$ | -2.61 | 0.93 | 1.70 | -0.69 | 2.15 | 1.31 | 0.29 | 4.23 |
| $\Delta C_8$ | 1.34 | 2.84 | 3.82 | -1.07 | 2.61 | 3.26 | 0.81 | 1.05 |
| $\Delta C_9$ | 2.50 | 2.65 | 3.58 | -1.89 | 1.85 | 3.08 | 0.33 | -0.86 |
| $\Delta C_{10}$ | 2.11 | 2.89 | 4.22 | -2.92 | 2.07 | 3.61 | -0.09 | -0.54 |
| $\Delta C_{11}$ | -0.01 | 0.93 | 1.87 | -2.49 | 0.70 | 1.41 | -0.69 | -0.30 |
| $\Delta C_{12}$ | -1.17 | 0.29 | 1.07 | -1.79 | 0.43 | 0.77 | -0.73 | 0.80 |
| $\Delta C_{13}$ | -2.93 | -0.67 | 0.03 | -1.28 | 0.00 | -0.26 | -0.92 | 1.66 |
| $\Delta C_{14}$ | -9.19 | -4.15 | -3.32 | -3.38 | -2.56 | -4.15 | -3.59 | -2.13 |
| $\Delta C_{15}$ | -7.53 | -3.58 | -3.15 | -2.82 | -2.22 | -3.82 | -2.96 | -2.48 |

Fig.15

| Filter | None | a | a+ | b | c | d | e | f |
|---|---|---|---|---|---|---|---|---|
| CCT: | 3930 | 3537 | 3157 | 3695 | 4017 | 3122 | 4585 | 4017 |
| Duv: | -0.001 | -0.006 | -0.006 | 0.007 | -0.008 | -0.005 | 0.000 | -0.004 |
| CRI Ra: | 78.6 | 89.3 | 90.2 | 89.1 | 92.6 | 89.2 | 89.1 | 93.7 |
| $\Delta C^*ab$ | -0.926 | 0.959 | 1.348 | -0.847 | 1.392 | 1.002 | 0.312 | 1.195 |
| $\Delta Cmax$ | 5.80 | 6.19 | 7.27 | 2.27 | 6.05 | 6.78 | 4.23 | 5.05 |
| $\Delta Cmin$ | -9.81 | -4.19 | -3.78 | -3.77 | -2.84 | -4.55 | -3.72 | -2.73 |
| $\Delta Cmax-min$ | 15.61 | 10.38 | 11.05 | 6.04 | 8.88 | 11.33 | 7.95 | 7.77 |
| $\Delta hmax$ | 11.17 | 8.17 | 7.48 | 5.21 | 8.14 | 7.48 | 7.95 | 4.57 |
| $\Delta hmin$ | 0.13 | 0.32 | 0.39 | 0.05 | 0.41 | 0.24 | 0.17 | 0.00 |
| B | 193.1 | 81.2 | 88.6 | 68.2 | 41.3 | 104.2 | 58.4 | 69.2 |
| $\Delta S(580)$ | -0.804 | -0.414 | -0.372 | -0.068 | -0.233 | -0.457 | -0.163 | 0.571 |
| $\Delta C_1$ | -0.19 | 1.12 | 1.21 | -0.45 | 1.35 | 0.92 | 0.35 | -0.23 |
| $\Delta C_2$ | 4.81 | 4.60 | 4.81 | 0.01 | 4.28 | 4.70 | 3.61 | 2.88 |
| $\Delta C_3$ | 3.63 | 3.13 | 2.89 | 1.69 | 3.51 | 2.63 | 3.63 | 2.09 |
| $\Delta C_4$ | -2.77 | -1.97 | -1.93 | -1.85 | -1.42 | -2.04 | -1.54 | -0.64 |
| $\Delta C_5$ | -6.33 | -3.87 | -3.78 | -3.03 | -2.84 | -3.91 | -3.36 | -0.38 |
| $\Delta C_6$ | -6.12 | -2.68 | -2.68 | -2.36 | -1.23 | -2.87 | -2.23 | 1.96 |
| $\Delta C_7$ | -1.73 | 1.90 | 2.18 | 0.33 | 3.11 | 1.77 | 1.50 | 5.05 |
| $\Delta C_8$ | 4.61 | 6.19 | 6.95 | 2.00 | 6.05 | 6.47 | 4.23 | 4.69 |
| $\Delta C_9$ | 5.80 | 5.94 | 6.73 | 1.07 | 5.35 | 6.29 | 3.78 | 2.88 |
| $\Delta C_{10}$ | 5.32 | 6.07 | 7.27 | -0.23 | 5.35 | 6.78 | 3.07 | 2.83 |
| $\Delta C_{11}$ | 1.03 | 1.96 | 2.80 | -1.95 | 1.72 | 2.45 | 0.20 | 0.49 |
| $\Delta C_{12}$ | -1.10 | 0.44 | 1.16 | -1.91 | 0.50 | 0.94 | -0.81 | 0.62 |
| $\Delta C_{13}$ | -3.59 | -1.08 | -0.49 | -1.78 | -0.53 | -0.73 | -1.53 | 0.90 |
| $\Delta C_{14}$ | -9.81 | -4.19 | -3.75 | -3.77 | -2.58 | -4.55 | -3.72 | -2.73 |
| $\Delta C_{15}$ | -7.44 | -3.17 | -3.15 | -2.73 | -1.74 | -3.82 | -2.49 | -2.49 |

Fig.17

| Filter | None | a | a+ | b | c | d | e | f |
|---|---|---|---|---|---|---|---|---|
| CCT: | 4278 | 3752 | 3308 | 3968 | 4429 | 3274 | 5206 | 4492 |
| Duv: | -0.002 | -0.009 | -0.010 | 0.005 | -0.009 | -0.008 | -0.002 | -0.005 |
| CRI Ra: | 88.7 | 95.4 | 95.3 | 97.8 | 93.2 | 95.6 | 96.5 | 89.4 |
| $\Delta C^*ab$ | -0.522 | 1.813 | 2.087 | -0.033 | 1.890 | 1.763 | 1.091 | 1.608 |
| $\Delta Cmax$ | 3.46 | 4.49 | 5.37 | 1.81 | 4.53 | 4.94 | 3.18 | 5.99 |
| $\Delta Cmin$ | -6.21 | -0.01 | -0.58 | -1.73 | 0.27 | -1.25 | -0.17 | -1.65 |
| $\Delta Cmax-min$ | 9.67 | 4.51 | 5.95 | 3.53 | 4.27 | 6.18 | 3.35 | 7.64 |
| $\Delta hmax$ | 7.33 | 4.24 | 4.22 | 1.71 | 3.98 | 3.94 | 4.27 | 3.30 |
| $\Delta hmin$ | 0.19 | 0.25 | 0.13 | 0.01 | 0.01 | 0.27 | 0.13 | 0.14 |
| B | 132.7 | -8.2 | 14.5 | -0.1 | -32.4 | 29.7 | -0.7 | 1.4 |
| $\Delta S(580)$ | -0.444 | 0.031 | 0.011 | 0.284 | 0.131 | -0.074 | 0.104 | 0.865 |
| $\Delta C_1$ | -1.73 | 0.48 | 0.54 | -1.25 | 0.27 | 0.25 | -0.08 | -1.65 |
| $\Delta C_2$ | 2.50 | 2.43 | 2.88 | 0.24 | 1.84 | 2.81 | 1.81 | 0.17 |
| $\Delta C_3$ | 3.46 | 2.79 | 2.81 | 1.61 | 3.00 | 2.61 | 2.74 | 1.71 |
| $\Delta C_4$ | -0.82 | 0.26 | 0.16 | 0.30 | 0.71 | 0.05 | 0.08 | 1.79 |
| $\Delta C_5$ | -3.07 | 0.01 | -0.33 | 0.25 | 0.77 | -0.47 | -0.17 | 3.19 |
| $\Delta C_6$ | -3.03 | 1.44 | 0.97 | 0.83 | 2.29 | 0.79 | 1.11 | 5.08 |
| $\Delta C_7$ | -0.74 | 4.04 | 3.96 | 1.81 | 4.53 | 3.59 | 3.18 | 5.99 |
| $\Delta C_8$ | 2.48 | 4.49 | 5.37 | 0.55 | 3.89 | 4.94 | 3.04 | 2.28 |
| $\Delta C_9$ | 2.92 | 3.04 | 4.28 | -1.14 | 2.01 | 3.90 | 1.61 | -0.58 |
| $\Delta C_{10}$ | 2.83 | 3.66 | 5.32 | -1.73 | 2.41 | 4.89 | 1.58 | -0.06 |
| $\Delta C_{11}$ | 0.86 | 1.86 | 2.90 | -1.38 | 1.31 | 2.58 | 0.52 | 0.33 |
| $\Delta C_{12}$ | -0.33 | 1.43 | 2.03 | -0.58 | 1.36 | 1.81 | 0.52 | 1.69 |
| $\Delta C_{13}$ | -1.77 | 1.10 | 1.28 | 0.33 | 1.57 | 1.01 | 0.60 | 3.04 |
| $\Delta C_{14}$ | -6.21 | 0.18 | -0.25 | -0.13 | 1.43 | -1.06 | -0.08 | 1.10 |
| $\Delta C_{15}$ | -5.18 | -0.01 | -0.58 | -0.22 | 0.96 | -1.25 | -0.11 | 0.03 |

Fig.19

| Filter | None | a | a+ | b | c | d | e | f |
|---|---|---|---|---|---|---|---|---|
| CCT: | 3941 | 3446 | 3082 | 3688 | 4007 | 3062 | 4602 | 4107 |
| Duv: | -0.004 | -0.010 | -0.011 | 0.002 | -0.012 | -0.009 | -0.004 | -0.008 |
| CRI Ra: | 87.6 | 95.6 | 95.0 | 96.8 | 93.0 | 95.2 | 96.8 | 90.0 |
| $\Delta C^*ab$ | -0.284 | 1.923 | 2.452 | 0.119 | 2.258 | 2.087 | 1.040 | 1.917 |
| $\Delta Cmax$ | 4.07 | 5.47 | 7.36 | 1.88 | 5.13 | 6.89 | 3.16 | 6.51 |
| $\Delta Cmin$ | -6.60 | -0.97 | -1.10 | -1.21 | 0.23 | -1.79 | -0.45 | -0.74 |
| $\Delta Cmax-min$ | 10.68 | 6.44 | 8.46 | 3.09 | 4.90 | 8.67 | 3.61 | 7.25 |
| $\Delta hmax$ | 7.18 | 4.76 | 4.85 | 2.58 | 4.33 | 4.90 | 4.50 | 4.00 |
| $\Delta hmin$ | 0.40 | 0.62 | 0.38 | 0.00 | 0.14 | 0.13 | 0.03 | 0.19 |
| B | 146.0 | 20.0 | 29.4 | 24.2 | -26.0 | 45.9 | 3.3 | 13.1 |
| $\Delta S(580)$ | -0.512 | -0.072 | -0.043 | 0.132 | 0.099 | -0.138 | 0.060 | 0.817 |
| $\Delta C_1$ | -0.86 | 1.01 | 1.09 | -0.58 | 1.19 | 0.80 | -0.05 | -0.74 |
| $\Delta C_2$ | 3.33 | 3.36 | 3.73 | 1.27 | 2.77 | 3.66 | 2.00 | 1.17 |
| $\Delta C_3$ | 2.97 | 2.48 | 2.62 | 1.45 | 2.60 | 2.43 | 2.76 | 1.50 |
| $\Delta C_4$ | -1.42 | -0.40 | -0.27 | -0.31 | 0.23 | -0.42 | -0.02 | 1.33 |
| $\Delta C_5$ | -3.57 | -0.88 | -0.94 | -0.53 | 0.42 | -1.17 | -0.45 | 2.75 |
| $\Delta C_6$ | -3.17 | 0.70 | 0.48 | 0.34 | 2.40 | 0.17 | 0.75 | 5.10 |
| $\Delta C_7$ | -0.41 | 3.83 | 4.03 | 1.88 | 5.13 | 3.56 | 2.94 | 6.51 |
| $\Delta C_8$ | 3.43 | 5.47 | 6.50 | 1.61 | 5.03 | 6.06 | 3.16 | 3.36 |
| $\Delta C_9$ | 4.03 | 4.54 | 5.84 | 0.31 | 3.32 | 5.47 | 1.88 | 0.74 |
| $\Delta C_{10}$ | 4.07 | 5.44 | 7.36 | -0.14 | 3.98 | 6.89 | 1.84 | 1.43 |
| $\Delta C_{11}$ | 1.32 | 2.68 | 4.08 | -0.78 | 1.99 | 3.70 | 0.58 | 0.89 |
| $\Delta C_{12}$ | -0.12 | 1.73 | 2.70 | -0.45 | 1.65 | 2.43 | 0.43 | 1.82 |
| $\Delta C_{13}$ | -1.83 | 0.83 | 1.41 | -0.06 | 1.49 | 1.10 | 0.45 | 2.76 |
| $\Delta C_{14}$ | -6.60 | -0.97 | -0.74 | -1.21 | 0.97 | -1.59 | -0.36 | 0.45 |
| $\Delta C_{15}$ | -5.43 | -0.97 | -1.10 | -1.03 | 0.71 | -1.79 | -0.32 | -0.35 |

Fig.21

| Filter | None | a | a+ | b | c | d | e | f |
|---|---|---|---|---|---|---|---|---|
| CCT: | 4470 | 3990 | 3518 | 4148 | 4621 | 3492 | 5289 | 4701 |
| Duv: | 0.003 | -0.003 | -0.004 | 0.009 | -0.004 | -0.003 | 0.005 | 0.001 |
| CRI Ra: | 83.4 | 94.5 | 95.1 | 92.7 | 96.3 | 94.2 | 93.5 | 94.7 |
| $\Delta C^*ab$ | -1.217 | 0.746 | 1.123 | -0.881 | 1.151 | 0.805 | 0.320 | 0.825 |
| $\Delta Cmax$ | 3.93 | 4.06 | 4.90 | 2.15 | 3.83 | 4.45 | 3.20 | 4.70 |
| $\Delta Cmin$ | -8.03 | -2.07 | -1.81 | -2.27 | -0.83 | -2.52 | -2.08 | -1.90 |
| $\Delta Cmax\text{-}min$ | 11.96 | 6.13 | 6.70 | 4.42 | 4.66 | 6.97 | 5.28 | 6.61 |
| $\Delta hmax$ | 9.31 | 6.10 | 5.85 | 3.79 | 5.65 | 5.56 | 5.76 | 2.57 |
| $\Delta hmin$ | 0.10 | 0.28 | 0.16 | 0.07 | 0.13 | 0.01 | 0.07 | 0.10 |
| B | 151.9 | 35.1 | 41.8 | 33.5 | -3.1 | 53.0 | 28.8 | 27.8 |
| $\Delta S(580)$ | -0.511 | -0.120 | -0.107 | 0.167 | 0.055 | -0.185 | 0.096 | 0.783 |
| $\Delta C_1$ | -1.94 | -0.13 | 0.15 | -1.72 | -0.17 | -0.07 | -0.51 | -1.90 |
| $\Delta C_2$ | 2.85 | 2.70 | 3.01 | 0.65 | 2.17 | 2.92 | 2.21 | 0.68 |
| $\Delta C_3$ | 3.93 | 3.24 | 3.07 | 2.15 | 3.57 | 2.82 | 3.20 | 2.13 |
| $\Delta C_4$ | -1.44 | -0.67 | -0.68 | -0.63 | -0.05 | -0.80 | -0.74 | 0.65 |
| $\Delta C_5$ | -4.45 | -1.81 | -1.76 | -1.58 | -0.83 | -1.89 | -1.76 | 1.31 |
| $\Delta C_6$ | -4.65 | -0.83 | -0.73 | -1.46 | 0.32 | -0.90 | -0.73 | 2.92 |
| $\Delta C_7$ | -1.63 | 2.38 | 2.81 | 0.29 | 3.30 | 2.43 | 2.05 | 4.70 |
| $\Delta C_8$ | 2.44 | 4.06 | 4.90 | 0.55 | 3.83 | 4.45 | 3.02 | 2.39 |
| $\Delta C_9$ | 3.00 | 2.93 | 3.76 | -0.80 | 2.25 | 3.36 | 1.87 | -0.15 |
| $\Delta C_{10}$ | 2.34 | 2.72 | 3.84 | -2.02 | 2.03 | 3.39 | 1.28 | -0.38 |
| $\Delta C_{11}$ | -0.05 | 0.57 | 1.24 | -2.27 | 0.47 | 0.91 | -0.33 | -0.62 |
| $\Delta C_{12}$ | -1.39 | 0.06 | 0.58 | -1.71 | 0.33 | 0.34 | -0.59 | 0.54 |
| $\Delta C_{13}$ | -2.94 | -0.35 | 0.02 | -0.99 | 0.45 | -0.25 | -0.63 | 1.86 |
| $\Delta C_{14}$ | -8.03 | -2.07 | -1.81 | -2.07 | -0.23 | -2.52 | -2.08 | -0.63 |
| $\Delta C_{15}$ | -6.30 | -1.60 | -1.55 | -1.61 | -0.18 | -2.11 | -1.48 | -1.13 |

Fig.23

| Filter | None | a | a+ | b | c | d | e | f |
|---|---|---|---|---|---|---|---|---|
| CCT: | 4414 | 4004 | 3466 | 4194 | 4623 | 3459 | 5373 | 4762 |
| Duv: | 0.000 | -0.006 | -0.008 | 0.007 | -0.007 | -0.006 | 0.001 | -0.003 |
| CRI Ra: | 86.4 | 92.3 | 91.8 | 93.8 | 90.8 | 91.7 | 93.0 | 85.5 |
| $\Delta C^*ab$ | -1.866 | 0.123 | 0.678 | -1.398 | 0.396 | 0.211 | -0.383 | 0.241 |
| $\Delta Cmax$ | 2.83 | 2.58 | 2.70 | 1.54 | 2.43 | 2.62 | 1.90 | 4.95 |
| $\Delta Cmin$ | -8.35 | -3.19 | -3.15 | -4.46 | -3.12 | -4.01 | -3.63 | -4.90 |
| $\Delta Cmax-min$ | 11.18 | 5.77 | 5.85 | 6.00 | 5.56 | 6.62 | 5.53 | 9.85 |
| $\Delta hmax$ | 6.98 | 1.92 | 2.48 | 2.22 | 1.84 | 3.46 | 1.58 | 4.58 |
| $\Delta hmin$ | 0.48 | 0.08 | 0.01 | 0.15 | 0.09 | 0.05 | 0.19 | 0.04 |
| B | 168.3 | 68.1 | 79.9 | 66.1 | 30.6 | 99.2 | 50.1 | 47.6 |
| $\Delta S(580)$ | -0.812 | -0.417 | -0.400 | -0.150 | -0.236 | -0.517 | -0.203 | 0.564 |
| $\Delta C_1$ | -4.82 | -3.03 | -2.49 | -4.46 | -3.12 | -2.88 | -3.63 | -4.90 |
| $\Delta C_2$ | -0.03 | 0.05 | 0.72 | -1.80 | -0.66 | 0.65 | -0.99 | -2.44 |
| $\Delta C_3$ | 2.83 | 2.58 | 2.70 | 1.54 | 2.43 | 2.62 | 1.90 | 1.19 |
| $\Delta C_4$ | 0.57 | 1.55 | 1.50 | 1.46 | 2.07 | 1.30 | 1.53 | 3.29 |
| $\Delta C_5$ | -1.56 | 0.95 | 0.86 | 1.00 | 1.95 | 0.47 | 1.25 | 4.44 |
| $\Delta C_6$ | -2.85 | 0.98 | 1.05 | 0.31 | 2.10 | 0.48 | 1.10 | 4.95 |
| $\Delta C_7$ | -3.28 | 0.86 | 1.36 | -0.96 | 1.70 | 0.66 | 0.49 | 3.24 |
| $\Delta C_8$ | -1.30 | 0.45 | 1.66 | -2.73 | 0.03 | 1.16 | -0.90 | -1.61 |
| $\Delta C_9$ | -0.28 | -0.17 | 1.24 | -3.52 | -1.18 | 0.89 | -1.82 | -3.80 |
| $\Delta C_{10}$ | 0.14 | 0.83 | 2.58 | -3.54 | -0.12 | 2.07 | -1.06 | -2.54 |
| $\Delta C_{11}$ | 0.45 | 1.22 | 2.26 | -1.41 | 0.96 | 1.83 | 0.26 | 0.14 |
| $\Delta C_{12}$ | -0.18 | 1.20 | 1.83 | -0.50 | 1.47 | 1.45 | 0.83 | 1.95 |
| $\Delta C_{13}$ | -1.78 | 0.54 | 0.86 | -0.12 | 1.37 | 0.38 | 0.65 | 3.02 |
| $\Delta C_{14}$ | -8.35 | -2.96 | -2.80 | -3.03 | -1.18 | -3.88 | -2.47 | -0.95 |
| $\Delta C_{15}$ | -7.55 | -3.19 | -3.15 | -3.21 | -1.89 | -4.01 | -2.87 | -2.34 |

Fig.25

| Filter | None | a | a+ | b | c | d | e | f |
|---|---|---|---|---|---|---|---|---|
| CCT: | 4457 | 4079 | 3502 | 4231 | 4673 | 3480 | 5388 | 4827 |
| Duv: | 0.002 | -0.005 | -0.007 | 0.008 | -0.006 | -0.005 | 0.003 | -0.001 |
| CRI Ra: | 86.6 | 96.4 | 95.4 | 96.4 | 95.2 | 95.4 | 97.7 | 90.3 |
| $\Delta C^*ab$ | -1.492 | 0.578 | 1.017 | -1.038 | 0.895 | 0.695 | 0.093 | 0.627 |
| $\Delta Cmax$ | 2.77 | 2.48 | 3.14 | 1.14 | 2.74 | 2.78 | 1.98 | 4.37 |
| $\Delta Cmin$ | -7.86 | -1.97 | -1.95 | -3.13 | -1.31 | -2.66 | -1.71 | -3.14 |
| $\Delta Cmax\text{-}min$ | 10.63 | 4.44 | 5.09 | 4.27 | 4.05 | 5.44 | 3.70 | 7.51 |
| $\Delta hmax$ | 7.04 | 3.34 | 3.12 | 1.61 | 2.47 | 3.15 | 2.25 | 3.40 |
| $\Delta hmin$ | 0.19 | 0.00 | 0.02 | 0.03 | 0.03 | 0.07 | 0.07 | 0.02 |
| B | 156.2 | 41.6 | 52.3 | 40.3 | 6.2 | 67.1 | 30.9 | 30.2 |
| $\Delta S(580)$ | -0.581 | -0.202 | -0.157 | 0.124 | -0.014 | -0.255 | 0.028 | 0.733 |
| $\Delta C_1$ | -2.87 | -1.17 | -0.93 | -2.78 | -1.31 | -1.12 | -1.71 | -3.14 |
| $\Delta C_2$ | 1.51 | 1.39 | 1.74 | -0.72 | 0.72 | 1.76 | 0.52 | -1.00 |
| $\Delta C_3$ | 2.77 | 2.48 | 2.48 | 1.14 | 2.53 | 2.24 | 1.98 | 1.19 |
| $\Delta C_4$ | -0.68 | 0.39 | 0.48 | 0.45 | 1.01 | 0.28 | 0.42 | 2.03 |
| $\Delta C_5$ | -2.95 | -0.18 | -0.09 | 0.25 | 0.89 | -0.32 | 0.17 | 3.24 |
| $\Delta C_6$ | -3.52 | 0.50 | 0.63 | 0.24 | 1.70 | 0.42 | 0.75 | 4.37 |
| $\Delta C_7$ | -2.39 | 1.87 | 2.28 | 0.06 | 2.74 | 1.96 | 1.50 | 4.11 |
| $\Delta C_8$ | 0.50 | 2.21 | 3.08 | -1.43 | 1.83 | 2.74 | 0.89 | 0.20 |
| $\Delta C_9$ | 1.40 | 1.35 | 2.34 | -2.56 | 0.41 | 2.07 | -0.19 | -2.18 |
| $\Delta C_{10}$ | 1.26 | 1.77 | 3.14 | -3.13 | 0.86 | 2.78 | -0.06 | -1.61 |
| $\Delta C_{11}$ | 0.18 | 0.94 | 1.84 | -1.91 | 0.73 | 1.50 | -0.03 | -0.22 |
| $\Delta C_{12}$ | -0.81 | 0.72 | 1.34 | -0.97 | 1.01 | 1.08 | 0.24 | 1.37 |
| $\Delta C_{13}$ | -2.33 | 0.28 | 0.66 | -0.22 | 1.12 | 0.35 | 0.28 | 2.67 |
| $\Delta C_{14}$ | -7.86 | -1.97 | -1.78 | -2.00 | -0.20 | -2.66 | -1.67 | -0.29 |
| $\Delta C_{15}$ | -6.59 | -1.92 | -1.95 | -1.98 | -0.63 | -2.64 | -1.69 | -1.35 |

Fig.27

| Filter | None | a | a+ | b | c | d | e | f |
|---|---|---|---|---|---|---|---|---|
| CCT: | 4976 | 4539 | 4033 | 4556 | 5386 | 3949 | 6120 | 5356 |
| Duv: | -0.001 | -0.003 | -0.006 | 0.009 | -0.009 | -0.004 | -0.001 | -0.004 |
| CRI Ra: | 68.4 | 77.8 | 80.5 | 76.5 | 82.1 | 79.4 | 77.8 | 85.0 |
| $\Delta C^*ab$ | -0.440 | 0.619 | 1.181 | -0.652 | 2.138 | 0.781 | 1.230 | 1.836 |
| $\Delta Cmax$ | 9.77 | 8.63 | 9.28 | 5.64 | 10.18 | 8.78 | 9.26 | 9.04 |
| $\Delta Cmin$ | -12.22 | -7.65 | -7.23 | -7.23 | -6.86 | -7.32 | -7.52 | -4.94 |
| $\Delta Cmax\text{-}min$ | 21.98 | 16.28 | 16.51 | 12.87 | 17.04 | 16.09 | 16.78 | 13.98 |
| $\Delta hmax$ | 22.72 | 17.43 | 15.45 | 13.85 | 18.63 | 14.74 | 20.20 | 12.99 |
| $\Delta hmin$ | 0.67 | 0.52 | 0.28 | 1.34 | 0.09 | 0.34 | 0.71 | 0.29 |
| B | 194.0 | 100.5 | 88.4 | 92.2 | 54.5 | 104.0 | 76.6 | 78.6 |
| $\Delta S(580)$ | -0.862 | -0.508 | -0.483 | -0.100 | -0.370 | -0.570 | -0.236 | 0.397 |
| $\Delta C_1$ | 1.57 | 1.88 | 2.47 | 0.79 | 3.80 | 2.10 | 2.70 | 2.30 |
| $\Delta C_2$ | 7.48 | 6.55 | 6.73 | 4.98 | 7.85 | 6.49 | 7.37 | 6.56 |
| $\Delta C_3$ | 8.40 | 7.19 | 6.28 | 5.34 | 8.35 | 5.79 | 9.04 | 6.41 |
| $\Delta C_4$ | -2.31 | -2.42 | -2.82 | -2.98 | -1.90 | -3.00 | -1.45 | -2.29 |
| $\Delta C_5$ | -9.90 | -7.65 | -7.23 | -7.23 | -6.86 | -7.32 | -7.52 | -4.94 |
| $\Delta C_6$ | -9.84 | -6.87 | -6.15 | -6.74 | -4.66 | -6.38 | -5.90 | -1.89 |
| $\Delta C_7$ | -1.97 | 0.68 | 1.68 | -0.43 | 3.46 | 1.17 | 1.83 | 5.31 |
| $\Delta C_8$ | 7.55 | 8.04 | 9.06 | 5.58 | 9.73 | 8.57 | 8.34 | 9.04 |
| $\Delta C_9$ | 9.77 | 8.63 | 9.28 | 5.64 | 10.18 | 8.78 | 9.26 | 8.30 |
| $\Delta C_{10}$ | 8.65 | 7.46 | 8.41 | 3.71 | 9.04 | 7.92 | 7.80 | 6.98 |
| $\Delta C_{11}$ | 1.91 | 1.43 | 1.99 | -1.13 | 2.39 | 1.64 | 1.52 | 0.98 |
| $\Delta C_{12}$ | -2.10 | -1.40 | -0.69 | -2.99 | -0.63 | -0.88 | -1.74 | -0.72 |
| $\Delta C_{13}$ | -5.94 | -3.66 | -2.79 | -4.09 | -2.75 | -3.03 | -3.95 | -1.31 |
| $\Delta C_{14}$ | -12.22 | -6.64 | -5.33 | -6.40 | -4.26 | -6.23 | -6.04 | -4.60 |
| $\Delta C_{15}$ | -7.67 | -3.93 | -3.18 | -3.84 | -1.67 | -3.95 | -2.82 | -2.60 |

Fig.29

| Filter | None | a | a+ | b | c | d | e | f |
|---|---|---|---|---|---|---|---|---|
| CCT: | 4502 | 4156 | 3739 | 4257 | 4630 | 3696 | 5186 | 4658 |
| Duv: | 0.007 | 0.004 | 0.002 | 0.016 | 0.000 | 0.003 | 0.008 | 0.005 |
| CRI Ra: | 65.7 | 76.0 | 78.5 | 74.7 | 79.3 | 77.5 | 74.5 | 82.7 |
| $\Delta C^*ab$ | -1.584 | -0.295 | 0.030 | -1.825 | 0.598 | -0.274 | -0.209 | 0.315 |
| $\Delta Cmax$ | 8.19 | 7.13 | 7.37 | 4.19 | 7.72 | 7.03 | 7.58 | 6.64 |
| $\Delta Cmin$ | -13.27 | -7.76 | -7.30 | -7.45 | -7.00 | -7.45 | -8.04 | -5.58 |
| $\Delta Cmax-min$ | 21.46 | 14.90 | 14.67 | 11.65 | 14.73 | 14.48 | 15.62 | 12.23 |
| $\Delta hmax$ | 19.87 | 14.93 | 13.29 | 12.28 | 15.55 | 12.84 | 16.86 | 10.98 |
| $\Delta hmin$ | 1.20 | 0.97 | 0.74 | 0.91 | 0.73 | 0.79 | 1.27 | 0.17 |
| B | 215.2 | 113.7 | 108.2 | 107.1 | 75.9 | 121.5 | 105.3 | 97.7 |
| $\Delta S(580)$ | -0.808 | -0.462 | -0.457 | -0.085 | -0.253 | -0.534 | -0.175 | 0.524 |
| $\Delta C_1$ | 0.75 | 1.26 | 1.39 | -0.10 | 1.84 | 1.26 | 1.56 | 0.46 |
| $\Delta C_2$ | 6.61 | 5.76 | 5.68 | 4.02 | 6.03 | 5.63 | 6.22 | 4.85 |
| $\Delta C_3$ | 6.49 | 5.61 | 5.03 | 4.19 | 6.53 | 4.61 | 6.63 | 4.94 |
| $\Delta C_4$ | -3.46 | -3.14 | -3.20 | -3.45 | -2.51 | -3.43 | -2.93 | -2.62 |
| $\Delta C_5$ | -10.22 | -7.76 | -7.30 | -7.42 | -7.00 | -7.45 | -8.04 | -5.15 |
| $\Delta C_6$ | -10.51 | -7.33 | -6.83 | -7.45 | -5.97 | -6.97 | -7.12 | -3.24 |
| $\Delta C_7$ | -3.16 | -0.35 | 0.23 | -1.87 | 1.20 | -0.09 | -0.03 | 2.99 |
| $\Delta C_8$ | 6.34 | 6.84 | 7.37 | 3.76 | 7.54 | 7.03 | 6.86 | 6.64 |
| $\Delta C_9$ | 8.19 | 7.13 | 7.25 | 3.52 | 7.72 | 6.93 | 7.58 | 5.69 |
| $\Delta C_{10}$ | 6.65 | 5.61 | 5.89 | 1.01 | 6.29 | 5.57 | 5.89 | 4.00 |
| $\Delta C_{11}$ | 0.27 | 0.01 | 0.22 | -3.03 | 0.65 | -0.07 | 0.00 | -0.83 |
| $\Delta C_{12}$ | -3.15 | -2.24 | -1.76 | -4.16 | -1.71 | -1.93 | -2.81 | -1.84 |
| $\Delta C_{13}$ | -6.53 | -4.05 | -3.34 | -4.71 | -3.26 | -3.57 | -4.76 | -1.86 |
| $\Delta C_{14}$ | -13.27 | -7.22 | -6.15 | -7.13 | -5.40 | -6.96 | -7.74 | -5.58 |
| $\Delta C_{15}$ | -8.77 | -4.55 | -4.03 | -4.55 | -2.99 | -4.67 | -4.45 | -3.74 |

Fig.31

| Filter | None | a | a+ | b | c | d | e | f |
|---|---|---|---|---|---|---|---|---|
| CCT: | 5172 | 4599 | 4102 | 4784 | 5520 | 4049 | 6266 | 5618 |
| Duv: | 0.000 | -0.006 | -0.008 | 0.010 | -0.006 | -0.006 | 0.002 | 0.000 |
| CRI Ra: | 84.8 | 95.7 | 95.6 | 93.2 | 94.9 | 94.6 | 94.6 | 92.9 |
| $\Delta C^*ab$ | -0.669 | 0.884 | 1.179 | -0.953 | 1.475 | 0.755 | 0.343 | 1.221 |
| $\Delta Cmax$ | 4.18 | 3.59 | 4.37 | 1.54 | 4.07 | 3.87 | 3.07 | 5.57 |
| $\Delta Cmin$ | -8.77 | -2.12 | -2.01 | -2.80 | -0.95 | -3.12 | -2.68 | -1.29 |
| $\Delta Cmax\text{-}min$ | 12.95 | 5.71 | 6.38 | 4.34 | 5.03 | 6.99 | 5.75 | 6.86 |
| $\Delta hmax$ | 9.20 | 5.59 | 5.83 | 2.49 | 5.35 | 5.64 | 5.05 | 4.05 |
| $\Delta hmin$ | 0.37 | 0.09 | 0.04 | 0.10 | 0.25 | 0.35 | 0.16 | 0.29 |
| B | 154.8 | 35.9 | 42.9 | 45.6 | 15.0 | 62.8 | 40.8 | 33.9 |
| $\Delta S(580)$ | -0.671 | -0.223 | -0.218 | 0.124 | -0.101 | -0.325 | -0.045 | 0.687 |
| $\Delta C_1$ | -0.61 | 0.03 | 0.30 | -2.03 | 0.74 | -0.22 | -0.54 | -1.01 |
| $\Delta C_2$ | 3.87 | 2.73 | 3.05 | 0.49 | 2.95 | 2.85 | 2.26 | 1.20 |
| $\Delta C_3$ | 3.56 | 2.99 | 2.95 | 1.54 | 2.96 | 2.85 | 3.07 | 1.14 |
| $\Delta C_4$ | -1.63 | -0.44 | -0.54 | -0.47 | -0.22 | -0.60 | -0.42 | 0.59 |
| $\Delta C_5$ | -4.24 | -1.19 | -1.33 | -1.03 | -0.36 | -1.58 | -1.28 | 2.18 |
| $\Delta C_6$ | -3.57 | 0.16 | 0.05 | -0.75 | 1.64 | -0.44 | -0.09 | 4.52 |
| $\Delta C_7$ | -0.83 | 2.62 | 2.90 | 0.10 | 4.05 | 2.21 | 1.88 | 5.57 |
| $\Delta C_8$ | 3.12 | 3.59 | 4.37 | -0.14 | 4.07 | 3.87 | 2.49 | 2.59 |
| $\Delta C_9$ | 4.18 | 2.68 | 3.56 | -1.07 | 2.74 | 3.20 | 1.71 | 0.13 |
| $\Delta C_{10}$ | 4.06 | 2.73 | 3.80 | -1.86 | 2.85 | 3.44 | 1.46 | 0.30 |
| $\Delta C_{11}$ | 1.09 | 0.91 | 1.49 | -1.74 | 1.05 | 1.26 | 0.14 | -0.03 |
| $\Delta C_{12}$ | -0.73 | 0.38 | 0.75 | -1.31 | 0.78 | 0.54 | -0.24 | 1.14 |
| $\Delta C_{13}$ | -3.02 | -0.17 | 0.02 | -0.85 | 0.44 | -0.34 | -0.61 | 2.19 |
| $\Delta C_{14}$ | -8.77 | -2.12 | -2.01 | -2.80 | -0.95 | -3.12 | -2.68 | -0.91 |
| $\Delta C_{15}$ | -6.52 | -1.65 | -1.66 | -2.35 | -0.63 | -2.59 | -1.99 | -1.29 |

Fig.33

MOBILE DEVICE

TECHNICAL FIELD

The present invention relates to a mobile device, and more particularly, to a mobile device including an imaging element.

BACKGROUND ART

Imaging devices such as video cameras and digital cameras have been miniaturized, and extremely compact digital cameras and video cameras are being developed. Although not a digital camera, an imaging element in a mobile phone now also has a greatly improved performance, and small-sized mobile devices that can obtain high quality images have become widespread.

In order to capture beautiful images even at night and backlighting, many such compact imaging devices are equipped with light-emitting devices (flashlights) as standard.

As a light-emitting device used for a flashlight, a xenon type (see, for example, Patent Document 1) and an LED type (see, for example, Patent Document 2) are known.

Incidentally, in order to evaluate a light emitted from a light-emitting device of general illumination, an indicator "color rendering property Ra" defined by CIE has been used for a long time. This indicator uses a light of the perfect radiator as a reference light, and numerically expresses a color shift from the reference light.

On the other hand, from a viewpoint different from the color rendering property Ra, illumination that can realize a natural, vivid, highly visible, and comfortable color appearance of subjects actually irradiated with light has been developed (for example, see Patent Documents 3, 4, and 5).

CITATION LIST

Patent Documents

Patent Document 1 Japanese Unexamined Patent Application Publication No. 2009-210837
Patent Document 2 Japanese Unexamined Patent Application Publication No. 2008-185816
Patent Document 3 WO2013/031942
Patent Document 4 WO2013/031943
Patent Document 5 WO2015/099115

Non Patent Documents

Non Patent Document 1 MIKE WOOD, *Television Lighting Consistency Index—TLCI*, page 24-28, FALL 2013

SUMMARY OF INVENTION

Technical Problem

In a mobile device with a light-emitting device (flashlight) as standard, in order to enable imaging in various situations, particularly in environments where illuminance is insufficient from evening to night, an operation to improve the sensitivity is carried out. However, with such an operation, the color reproducibility of images tends to be insufficient.

An object of the present invention is to provide a mobile device equipped with a flashlight that improves sensitivity and color reproducibility of images.

Solution to Problem

The inventors studied an LED flashlight for making images picked up by an imaging device with improved sensitivity look vivid. In order to enable imaging in various situations, particularly in environments where illuminance is insufficient from evening to night, generally, the sensitivity of an imaging element is improved by making an overlap of a blue spectral sensitivity spectrum and a green spectral sensitivity spectrum, and an overlap of a green spectral sensitivity spectrum and a red spectral sensitivity spectrum in the spectral sensitivity spectrum of a color sensor mounted on the imaging element larger than those in basic RGB separation filters.

However, although it is possible to improve the sensitivity by overlapping the spectral sensitivity spectra of such two color regions, such an operation adversely affects the color reproducibility of an image. In other words, the sensitivity improvement and the color reproducibility are in a trade-off relationship.

Under such circumstances, in order to achieve both the sensitivity improvement and the color reproducibility in a trade-off relationship, the present inventors have conducted extensive studies to find that, by using a light-emitting device that emits light having a specific relationship as compared with the reference light corresponding to a correlated color temperature in a specific wavelength region as a flashlight, suitable color reproducibility can be realized, thereby completing the present invention.

The present invention includes the following.

A mobile device including: at least an imaging element; and a light-emitting device that irradiates a subject in accordance with imaging of the imaging element, wherein the light-emitting device includes a semiconductor light-emitting element, and if a spectral power distribution of light emitted from the light-emitting device is denoted by $\varphi_{SSL}(\lambda)$, a spectral power distribution of a reference light that is selected according to the correlated color temperature $T_{SSL}$ (K) of the light emitted from the light-emitting device is denoted by $\varphi_{ref}(\lambda)$, tristimulus values of the light emitted from the light-emitting device are denoted by ($X_{SSL}, Y_{SSL}, Z_{SSL}$), and tristimulus values of the reference light that is selected according to the correlated color temperature $T_{SSL}$ (K) of the light emitted from the light-emitting device are denoted by ($X_{ref}, Y_{ref}, Z_{ref}$), and if a normalized spectral power distribution $S_{SSL}(\lambda)$ of light emitted from the light-emitting device, a normalized spectral power distribution $S_{ref}(\lambda)$ of a reference light that is selected according to the correlated color temperature $T_{SSL}$ (K) of the light emitted from the light-emitting device, and a difference $\Delta S(\lambda)$ between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}, \text{ and}$$

$$\Delta S(\lambda) = S_{ref}(\lambda) - S_{SSL}(\lambda),$$

the difference $\Delta S$ (580) of the normalized spectral power distribution at a wavelength of 580 nm is larger than zero, and a value B representing a difference between normalized spectral power distributions in a wavelength range from 540 nm to 610 nm and a wavelength range from 610 nm to 680 nm represented by the following Formula (1) is 65 or less.

[Math. 1]

$$B = \int_{540}^{610} -\Delta S(\lambda) d\lambda + \int_{610}^{680} \Delta S(\lambda) d\lambda \quad (1)$$

Another aspect of the present invention includes the following.

A mobile device including: at least an imaging element; and a light-emitting device that irradiates a subject in accordance with imaging of the imaging element, wherein the light-emitting device includes a semiconductor light-emitting element, and if a spectral power distribution of light emitted from the light-emitting device is denoted by $\varphi_{SSL}(\lambda)$, a spectral power distribution of a reference light that is selected according to the correlated color temperature $T_{SSL}$ (K) of the light emitted from the light-emitting device is denoted by $\varphi_{ref}(\lambda)$, tristimulus values of the light emitted from the light-emitting device are denoted by $(X_{SSL}, Y_{SSL}, Z_{SSL})$, and tristimulus values of the reference light that is selected according to the correlated color temperature $T_{SSL}$ (K) of the light emitted from the light-emitting device are denoted by $(X_{ref}, Y_{ref}, Z_{ref})$, and if a normalized spectral power distribution $S_{SSL}(\lambda)$ of light emitted from the light-emitting device, a normalized spectral power distribution $S_{ref}(\lambda)$ of a reference light that is selected according to the correlated color temperature $T_{SSL}$ (K) of the light emitted from the light-emitting device, and a difference $\Delta S(\lambda)$ between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}, \text{ and}$$

$$\Delta S(\lambda) = S_{ref}(\lambda) - S_{SSL}(\lambda),$$

the difference $\Delta S$ (580) of the normalized spectral power distribution at a wavelength of 580 nm is larger than zero, the difference $\Delta S$ (from 540 to 610) of the normalized spectral power distribution in the wavelength range from 540 nm to 610 nm represented by the following Formula (2) is −15 or more, and the difference $\Delta S$ (from 610 to 680) of the normalized spectral power distribution in the wavelength range from 610 nm to 680 nm represented by the following Formula (3) is 50 or less.

[Math. 2]

$$\Delta S(540\sim610) = \int_{540}^{610} \Delta S(\lambda) d\lambda \quad (2)$$

[Math. 3]

$$\Delta S(610\sim680) = \int_{610}^{680} \Delta S(\lambda) d\lambda \quad (3)$$

The present inventors pursued means for obtaining a captured image having favorable color reproducibility and the like, and found that even when color reproducibility or the like of a light-emitting device itself is insufficient, color reproducibility and the like of a captured image is improved by arranging a wavelength control element on the light-emitting side of the light-emitting device and satisfying the requirement for outgoing light through the wavelength control element.

Still another aspect of the present invention includes the following.

A mobile device including: at least an imaging element; a light-emitting device that irradiates a subject in accordance with imaging of the imaging element; and a wavelength control element arranged on a subject side of the light-emitting device, wherein the light-emitting device includes a semiconductor light-emitting element, and if a spectral power distribution of light emitted from the light-emitting device through the wavelength control element is denoted by $\varphi_{SSL}(\lambda)$, a spectral power distribution of a reference light that is selected according to the correlated color temperature $T_{SSL}$ (K) of the light emitted from the light-emitting device through the wavelength control element is denoted by $\varphi_{ref}(\lambda)$, tristimulus values of the light emitted from the light-emitting device through the wavelength control element are denoted by $(X_{SSL}, Y_{SSL}, Z_{SSL})$, and tristimulus values of the reference light that is selected according to the correlated color temperature $T_{SSL}$ (K) of the light emitted from the light-emitting device through the wavelength control element are denoted by $(X_{ref}, Y_{ref}, Z_{ref})$, and if a normalized spectral power distribution $S_{SSL}(\lambda)$ of light emitted from the light-emitting device through the wavelength control element, a normalized spectral power distribution $S_{ref}(\lambda)$ of a reference light that is selected according to the correlated color temperature $T_{SSL}$ (K) of the light emitted from the light-emitting device through the wavelength control element, and a difference $\Delta S$ (?) between these normalized spectral power distributions are respectively defined as $$S_{SSL}(\lambda) = \varphi_{SSL}(\lambda)/Y_{SSL},$$

$$S_{ref}(\lambda) = \varphi_{ref}(\lambda)/Y_{ref}, \text{ and}$$

$$\Delta S(\lambda) = S_{ref}(\lambda) - S_{SSL}(\lambda), \text{ and}$$

at least one of the following Condition X, Condition Y, and Condition Z is satisfied.

Condition X:

$D_{uv}$ is from −0.04 to 0.01, if an a* value and a b* value in CIE 1976 L*a*b* color space of 15 Munsell renotation color samples from #01 to #15 listed below when mathematically assuming illumination by the light emitted from the light-emitting device through a wavelength control element in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to the correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ is from −5.0 to 15.0, and an average of the $\Delta C_n$ (n is any natural number from 1 to 15) is from −0.6 to 6.0.

Condition Y:

the difference $\Delta S$ (580) of the normalized spectral power distribution at a wavelength of 580 nm is larger than zero, and a value B representing a difference between normalized spectral power distributions in a wavelength range from 540 nm to 610 nm and a wavelength range from 610 nm to 680 nm represented by the following Formula (1) is 65 or less.

[Math. 4]

$$B = \int_{640}^{610} -\Delta S(\lambda)d\lambda + \int_{610}^{680} \Delta S(\lambda)d\lambda \quad (1)$$

Condition Z:

$D_{uv}$ is from −0.04 to 0.01, if an a* value and a b* value in CIE 1976 L*a*b* color space of 15 Munsell renotation color samples from #01 to #15 listed below when mathematically assuming illumination by the light emitted from the light-emitting device through a wavelength control element in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to the correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ is from −7.0 to 15.0, an average of the $\Delta C_n$ (n is any natural number from 1 to 15) is from −0.6 to 6.0, and $\Delta C_{14}$ is from −5.0 to 15.

Advantageous Effects of Invention

According to one aspect of the present invention, it is possible to provide an imaging mobile device that achieves sensitivity improvement and color reproducibility that are in a trade-off relationship. Further, according to another embodiment of the present invention, it is possible to provide an imaging mobile device with improved color reproducibility and the like of a captured image.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 11 shows parameters relating to the spectrum of outgoing light through a filter when seven kinds of filters are applied to the light source 1.

FIG. 13 shows parameters relating to the spectrum of outgoing light through a filter when seven kinds of filters are applied to a light source 2.

FIG. 15 shows parameters relating to the spectrum of outgoing light through a filter when seven kinds of filters are applied to the light source 3.

FIG. 17 shows parameters relating to the spectrum of outgoing light through a filter when seven kinds of filters are applied to the light source 4.

FIG. 19 shows parameters relating to the spectrum of outgoing light through a filter when seven kinds of filters are applied to the light source 5.

FIG. 21 shows parameters relating to the spectrum of outgoing light through a filter when seven kinds of filters are applied to the light source 6.

FIG. 23 shows parameters relating to the spectrum of outgoing light through a filter when seven kinds of filters are applied to the light source 7.

FIG. 25 shows parameters relating to the spectrum of outgoing light through a filter when seven kinds of filters are applied to the light source 8.

FIG. 27 shows parameters relating to the spectrum of outgoing light through a filter when seven kinds of filters are applied to the light source 9.

FIG. 29 shows parameters relating to the spectrum of outgoing light through a filter when seven kinds of filters are applied to the light source 10.

FIG. 31 shows parameters relating to the spectrum of outgoing light through a filter when seven kinds of filters are applied to the light source 11.

FIG. 33 shows parameters relating to the spectrum of outgoing light through a filter when seven kinds of filters are applied to the light source 12.

DESCRIPTION OF EMBODIMENTS

Figure 1:
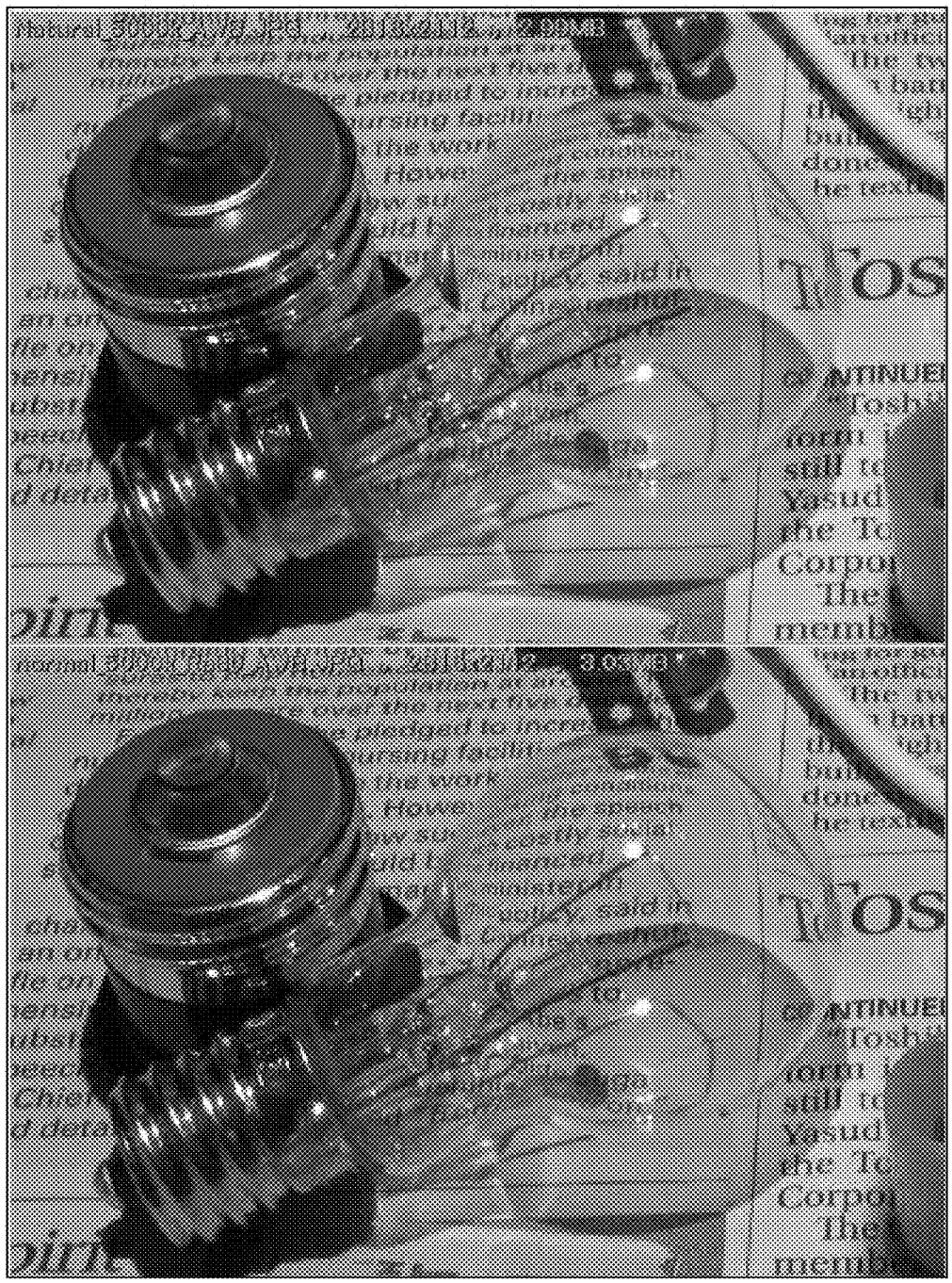
FIG. 1 is images captured by using a comparative reference light source A and a reference light source C (drawing substitute photograph).

Hereinafter, the present invention will be described in more detail.

One embodiment of the present invention is a mobile device including at least an imaging element and a light-emitting device that irradiates a subject in conjunction with imaging of the imaging element.

The imaging element is an electronic component that converts incident light from a lens into an electric signal, and is mainly used for capturing a digital image. Specific examples thereof include CCD and CMOS, but are not particularly limited thereto.

Examples of the mobile device including the imaging element include a smartphone, a tablet, a digital camera, and a digital video camera, but are not limited thereto.

The light-emitting device that irradiates a subject in conjunction with imaging by an imaging element is a device generally called a flash. In the present embodiment, the light-emitting device is a device that emits momentary light (flash) as it is called flash, which may have an irradiation period of within 1 second, an irradiation period of within 0.5 seconds, an irradiation period of within 0.4 seconds, or an irradiation period of within 0.3 seconds or less. Alternatively, such flash usually have an irradiation period of 0.01 seconds or more, and may have an irradiation period of 0.02 seconds or more.

Note that the light-emitting device may be any device capable of emitting flash and may be a device capable of emitting stationary light. In other words, the light-emitting device may be capable of emitting flash in a flash mode and may be capable of emitting stationary light in a torch mode.

In one embodiment, the light emitting-device includes a semiconductor light emitting element as a light emitting element, and the difference $\Delta S$ (580) of the normalized spectral power distribution at a wavelength of 580 nm is larger than zero. A value B representing a difference between normalized spectral power distributions in a wavelength range from 540 nm to 610 nm and a wavelength range from 610 to 680 represented by the following Formula (1) is 65 or less.

[Math. 5]

$$B = \int_{540}^{610} -\Delta S(\lambda) d\lambda + \int_{610}^{680} \Delta S(\lambda) d\lambda \quad (1)$$

More specifically, $\Delta S$ (580) is the difference between the normalized spectral power distribution of light emitted from the light-emitting device at a wavelength of 580 nm and the reference light if a spectral power distribution of light emitted from the light-emitting device is denoted by $\varphi_{SSL}(\lambda)$, a spectral power distribution of a reference light that is selected according to the correlated color temperature $T_{SSL}$ (K) of the light emitted from the light-emitting device is denoted by $\varphi_{ref}(\lambda)$, tristimulus values of the light emitted from the light-emitting device are denoted by $(X_{SSL}, Y_{SSL}, Z_{SSL})$, and tristimulus values of the reference light that is selected according to the correlated color temperature $T_{SSL}$ (K) of the light emitted from the light-emitting device are denoted by $(X_{ref}, Y_{ref}, Z_{ref})$, and if a normalized spectral power distribution $S_{SSL}(\lambda)$ of light emitted from the light-emitting device, a normalized spectral power distribution $S_{ref}(\lambda)$ of a reference light that is selected according to the correlated color temperature $T_{SSL}$ (K) of the light emitted from the light-emitting device, and a difference $\Delta S(\lambda)$ between these normalized spectral power distributions are respectively defined as $S_{SSL}(\lambda) = \varphi_{SSL}(\lambda)/Y_{SSL}$, $S_{ref}(\lambda) = \varphi_{ref}(\lambda)/Y_{ref}$, and $\Delta S(\lambda) = S_{ref}(\lambda) - S_{SSL}(\lambda)$, and in the present embodiment, the difference is larger than zero. This means that, at a wavelength of 580 nm, the intensity of light emitted from the light emitting-device according to the embodiment is lower than the reference light corresponding to the correlated color temperature.

The value B representing the difference between normalized spectral power distributions in a wavelength range from 540 nm to 610 nm and a wavelength range from 610 nm to 680 nm represented by the above Formula (1) is 65 or less. When B is 65 or less, in the wavelength range from 540 nm to 610 nm, the intensity of light emitted from the light emitting-device according to the present embodiment is not too high as compared with the reference light corresponding to the correlated color temperature, in the wavelength range from 610 nm to 680 nm, the intensity of light emitted from the light-emitting device according to the present embodiment is not too low as compared with the reference light corresponding to the correlated color temperature, and the intensity of light emitted from the light-emitting device according to the embodiment is not too low as compared with the reference light corresponding to the correlated color temperature in the wavelength range from 540 nm to 610 nm and the wavelength range from 610 nm to 680 nm. The B value may be 50 or less, and may be 40 or less. Although the lower limit value is not particularly limited, it is usually −500 or more and may be −300 or more.

As described above, when the light-emitting device included in a mobile device equipped with an imaging element includes a semiconductor light emitting element as a light emitting element, and light emitted from the light-emitting device satisfies that the $\Delta S$ (580) is larger than zero and the B value is 65 or less, an imaging mobile device achieving both sensitivity improvement and color reproducibility in a trade-off relationship can be provided.

Since, in imaging devices, sensitivity improvement is demanded in order to enable imaging in various situations, the present inventors took into consideration improvements to an imaging element which are being made in view of such a demand, and it was possible to achieve both sensitivity improvement and color reproducibility in a trade-off relationship by appropriately setting the difference from the normalized spectrum in a specific wavelength region, based on a finding that particularly a overlapping portion of a green region and a red region of a color sensor mounted on the imaging element promotes color fog and deteriorates color reproducibility and a finding that dullness of color is conspicuous due to insufficient strength of red region.

More specifically, 540 nm is the wavelength corresponding to the green peak of the color sensor, and 610 nm is the wavelength corresponding to the red peak of the color sensor. The wavelength range from 540 to 610 nm is a region between the green peak and the red peak of the color sensor, and it was possible to achieve both sensitivity improvement and color reproducibility in a trade-off relationship by reducing the spectral intensity at 580 nm which is the substantially central part of the wavelength range as compared with the reference light, by making the spectral intensity in the wavelength range suppressed as compared with the reference light, and further, by making the spectrum intensity in the red region from 610 to 680 nm not insufficient as compared with the reference light.

In another embodiment of the present invention, the light-emitting device includes a semiconductor light emitting element as a light emitting element, and a difference $\Delta S$ (580) in a normalized spectral power distribution at a wavelength of 580 nm is larger than zero. The difference ΔS (540 to 610) of the normalized spectral power distribution between light emitted from the light-emitting device and the reference light in the wavelength region from 540 nm to 610 nm represented by the following Formula (2) is −15 or more, and the difference ΔS (610 to 680) of the normalized spectral power distribution between light emitted from the light-emitting device and the reference light in the wavelength region from 610 nm to 680 nm represented by the following Formula (3) is 50 or less.

[Math. 6]

$$\Delta S(540\sim 610) = \int_{540}^{610} \Delta S(\lambda) d\lambda \quad (2)$$

[Math. 7]

$$\Delta S(610\sim 680) = \int_{610}^{680} \Delta S(\lambda) d\lambda \quad (3)$$

ΔS (540 to 610) is −15 or more, and may be −14 or more, may be −13 or more, may be −12 or more, or may be −11.5 or more. The upper limit is not particularly limited, and is usually 70 or less.

ΔS (610 to 680) is 50 or less, and may be 45 or less, may be 40 or less, may be 35 or less, and may be 30 or less. The lower limit is not particularly limited, and is usually −250 or more.

The values of ΔS (580), B value, ΔS (540 to 610), and ΔS (610 to 680) within the above ranges can be realized by a method such as using a green phosphor which can realize increasing the emission intensity on the short wavelength side of the green emission region and/or lowering the emission intensity on the long wavelength side of the green emission region in an emission spectrum or using a red phosphor having a long wavelength side light emission peak out of the red light emitting region.

As another embodiment, a mobile device in which the ΔS (580) and B value, or the ΔS (580), ΔS (540 to 610), and ΔS (610 to 680) of a mounted light-emitting device are not within the above ranges and both sensitivity improvement and color reproducibility which are advantageous effects of the present invention are not realized by itself, but by providing a wavelength control element on a subject side of the light-emitting device, the ΔS (580) and B value, or the ΔS (580), ΔS (540 to 610), and ΔS (610 to 680) are within the ranges of the above embodiment may also be included in the present invention.

Typical examples of the wavelength control element include a cut filter that reduces the wavelength intensity of a specific wavelength range by reflection and/or absorption, but are not limited thereto, and the wavelength control element may be a lens having a light condensing function or a light diffusing function.

In one embodiment, it is preferred that the mobile device is an imaging device capable of realizing a natural, vivid, highly visible, and comfortable color appearance of an image taken by the imaging device.

Realizing a natural, vivid, highly visible, and comfortable color appearance of an image specifically means that the television lighting consistency index (TLCI) value described in Non Patent Document 1 is high, and the TLCI may be 85 or more, may be 90 or more, may be 93 or more, may be 95 or more, may be 97 or more, may be 98 or more, or may be 99 or more.

The TLCI solves a problem that the visibility in human eyes and the visibility in a detector of a camera using, for example, a CCD sensor are totally different from each other, and the TLCI provides criteria for images such as television or video cameras similar to color rendering index (CRI) and color quality scale (CQS). Details are as disclosed in Non Patent Document 1, which are comparison with perfect blackbody radiation or sunlight according to the correlated color temperature.

In the light-emitting device used in one embodiment, in order for an image to realize a natural, vivid, highly visible, and comfortable color appearance, outgoing light preferably has a $D_{uv}$ from −0.04 to 0.002, or satisfies the following Conditions I to IV. Descriptions of the following Conditions I to IV are understood with reference to the contents of Patent Documents 3 to 5.

Condition I:

If an a* value and a b* value in CIE 1976 L*a*b* color space of 15 Munsell renotation color samples from #01 to #15 listed below when mathematically assuming illumination by the light emitted in the radiant direction from the light-emitting device are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to the correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ satisfies −4.0≤$\Delta C_n$≤18.6 (where n is a natural number from 1 to 15).

The range of $\Delta C_n$ is preferably −4.0 or more, and more preferably −3.8 or more, and is preferably 18.6 or less, and more preferably 17.0 or less.

Condition II:

The average of $\Delta C_n$ (n is an integer from 1 to 15) is from 0 to 7.0.

The average of $\Delta C_n$ (n is any integer from 1 to 15) is preferably 0 or more, and more preferably 0.5 or more, and is preferably 7.0 or less, and more preferably 6.4 or less.

Condition III

The difference between the maximum value and the minimum value of the $\Delta C_n$ (n is any integer from 1 to 15) is 2.0 or more and 19.6 or less. The difference between the maximum value and the minimum value of $\Delta C_n$ (n is any integer from 1 to 15) is preferably 2.0 or more, and more preferably 3.22 or more, and is preferably 19.6 or less, and more preferably 17.9 or less, where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| #01 | 7.5P | 4/10 |
| #02 | 10PB | 4/10 |
| #03 | 5PB | 4/12 |
| #04 | 7.5B | 5/10 |
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

If hue angles in CIE 1976 L*a*b* color space of the 15 Munsell renotation color samples when mathematically assuming illumination by light emitted from the light-emitting device are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction from the light-emitting device are denoted by $\theta_{nref}$ (degrees) (where n is a natural number from 1 to 15), then an absolute value of each difference in hue angles $|\Delta h_n|$ satisfies $0 \leq |\Delta h_n| \leq 12.5$ (degree) (where n is a natural number from 1 to 15), where $\Delta h_n = \theta_{nSSL} - \theta_{nref}$.

The absolute value IAN of the hue angle difference may be 9.0 or less.

Another embodiment of the present invention is a mobile device capable of improving color reproducibility of a captured image by providing a wavelength control element on a subject side of a light-emitting device. It is found that, when the wavelength control element is a cut filter that reduces the wavelength intensity of a particular wavelength range by reflection and/or absorption, a part of light emitted from the light-emitting device is reflected and/or absorbed by the wavelength control element, whereby the color reproducibility of a captured image tends to be improved and to look more vivid.

In the present embodiment, when a wavelength control element is arranged on a subject side of the light-emitting device, a mobile device that can improve the color reproducibility of a captured image is as follows.

A mobile device including: at least an imaging element; a light-emitting device that irradiates a subject in accordance with imaging of the imaging element; and a wavelength control element arranged on a subject side of the light-emitting device, wherein the light-emitting device includes a semiconductor light-emitting element, and if a spectral power distribution of light emitted from the light-emitting device through the wavelength control element is denoted by $\varphi_{SSL}(\lambda)$, a spectral power distribution of a reference light that is selected according to the correlated color temperature $T_{SSL}$ (K) of the light emitted from the light-emitting device through the wavelength control element is denoted by $\varphi_{ref}(\lambda)$, tristimulus values of the light emitted from the light-emitting device through the wavelength control element are denoted by $(X_{SSL}, Y_{SSL}, Z_{SSL})$, and tristimulus values of the reference light that is selected according to the correlated color temperature $T_{SSL}$ (K) of the light emitted from the light-emitting device through the wavelength control element are denoted by $(X_{ref}, Y_{ref}, Z_{ref})$, and if a normalized spectral power distribution $S_{SSL}(\lambda)$ of light emitted from the light-emitting device through the wavelength control element, a normalized spectral power distribution $S_{ref}(\lambda)$ of a reference light that is selected according to the correlated color temperature $T_{SSL}$ (K) of the light emitted from the light-emitting device through the wavelength control element, and a difference $\Delta S$ (?) between these normalized spectral power distributions are respectively defined as $S_{SSL}(\lambda) = \varphi_{SSL}(\lambda)/Y_{SSL}$, $S_{ref}(\lambda) = \varphi_{ref}(\lambda)/Y_{ref}$, and $\Delta S(\lambda) = S_{ref}(\lambda) - S_{SSL}(\lambda)$, and at least one of the following Condition X, Condition Y, and Condition Z is satisfied.

Condition X:
$D_{uv}$ is from −0.04 to 0.01,
the $\Delta C_n$ (n is a natural number from 1 to 15) is from −5.0 to 15.0, and
an average of the $\Delta C_n$ (n is any natural number from 1 to 15) is from −0.6 to 6.0.

Condition Y:
the difference $\Delta S$ (580) of the normalized spectral power distribution at a wavelength of 580 nm is larger than zero, and
a value B representing a difference between normalized spectral power distributions in a wavelength range from 540 nm to 610 nm and a wavelength range from 610 nm to 680 nm represented by the following Formula (1) is 65 or less.

[Math. 8]

$$B = \int_{540}^{610} -\Delta S(\lambda) d\lambda + \int_{610}^{680} \Delta S(\lambda) d\lambda \qquad (1)$$

Condition Z:
$D_{uv}$ is from −0.04 to 0.01,
the $\Delta C_n$ (n is a natural number from 1 to 15) is from −7.0 to 15.0,
an average of the $\Delta C_n$ (n is any natural number from 1 to 15) is from −0.6 to 6.0, and
$\Delta C_{14}$ is from −5.0 to 15.

It is preferable that at least two of the above Conditions X, Y, and Z are satisfied for a mobile device including a wavelength control element, and it is more preferable that all of the Conditions are satisfied. In addition to satisfying at least one of the above Conditions X, Y, and Z, satisfying at least one of the following requirements (i) to (vi) makes a captured image further preferable.

(i) $\Delta C_{14} \geq -5.0$
(ii) $-0.02 \leq D_{uv} < 0$
(iii) An average of the $\Delta C_n$ (n is any natural number from 1 to 15) is from more than 0 to 3.
(iv) The $\Delta C_n$ (n is a natural number from 1 to 15) is from −4.5 to 8.0.
(v) If hue angles in CIE 1976 L*a*b* color space of the 15 Munsell renotation color samples when mathematically assuming illumination by the light emitted from the light-emitting device through the wavelength control element are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 13.0$ (where n is a natural number from 1 to 15),
where $\Delta h_n = \theta_{nSSL} - \theta_{nref}$.
(vi) $\Delta C_{12} \geq -0.5$.

The Conditions X, Y, and Z can be derived from results of experiments, and the experiment results and considerations will be described below.

The wavelength control element included in the mobile device according to the embodiment is not limited as long as light emitted in the radiation direction from the light-emitting device through the wavelength control element satisfies the above Conditions X, Y, and Z, and is preferably a wavelength control element having at least one of the following characteristics.

Through the wavelength control element, $D_{uv}$ of outgoing light is declined.

Through the wavelength control element, the average $\Delta C_n$ (n is any integer from 1 to 15) of the outgoing light is increased.

Through the wavelength control element, the shape of the spectrum of the outgoing light has a bottom peak (downwardly convex peak) in the region from 510 nm to 590 nm.

Through the wavelength control element, in the spectral shape of the outgoing light, the wavelength representing the top peak shifts to a long wavelength side in the region from 580 nm to 780 nm, and the half width of the top peak is large.

Through the wavelength control element, $\Delta C_{14}$ of the outgoing light is increased, and is preferably increased by 4 or more.

Through the wavelength control element, $\Delta C_{14}$ and $\Delta C_{12}$ of the outgoing light are changed in such a manner that the absolute value of the increase amount of $\Delta C_{14}/\Delta C_{12}$ is 1 or more.

Through the wavelength control element, $\Delta C_{15}$ of the outgoing light is increased, and is preferably increased by 3 or more.

Through the wavelength control element, the absolute value $|\Delta h_n|$ of the hue angle difference of the outgoing light is reduced.

Although the wavelength control element having the above characteristics is typically a filter, the element may be a lens or a cover, and is not particularly limited as long as the element is a member or the like capable of controlling the wavelength.

When the wavelength control element is a filter, the method for producing the filter having the above characteristics is not particularly limited, and examples thereof include: providing a coloring composition layer on the surface of a base material such as transparent glass or transparent plastic by coating, vapor deposition, or sticking; and adding a coloring agent or the like and kneading a base material such as transparent glass or transparent plastic when preparing a transparent, semitransparent or colored base material.

As long as a wavelength control element is arranged on a subject side of a light-emitting device, the wavelength control element may be provided in contact with the light-emitting device, may be separated from the light-emitting device, or may be integrated with the light-emitting device.

For a mobile device having a wavelength control element on a subject side of a light-emitting device, the light-emitting device is not particularly limited as long as light emitted through the wavelength control element satisfies at least one of the Condition X, the Condition Y, and the Condition Z. By making the wavelength control element appropriate, even a light-emitting device having an average color rendering index Ra of approximately 65, which is conventionally thought to be not so favorable in color reproducibility can be used as the light-emitting device in the present embodiment. However, by using a light-emitting device having an Ra of 80 or more, a mobile device that emits light through a wavelength control element satisfies at least one of the Condition X, Condition Y, and Condition Z can be easily manufactured.

In an embodiment of the present invention, a semiconductor light-emitting element is included as a light emitting element.

The semiconductor light-emitting device is not particularly limited as long as the device can be used as a light emitting element, and is not limited to a violet or blue semiconductor light emitting element typically used, and may include a green semiconductor light emitting element, a red semiconductor light emitting element, or the like.

In the present embodiment, the violet semiconductor light-emitting element is a semiconductor light-emitting element in which the emission peak wavelength region is usually from 390 nm to 430 nm. The blue semiconductor light-emitting element is a semiconductor light-emitting element in which the emission peak wavelength region is usually from 430 nm to 490 nm. In the blue semiconductor light-emitting element, the lower limit of the emission peak wavelength may be 435 nm, or may be 440 nm. The upper limit of the emission peak wavelength may be 480 nm or less, may be 475 nm or less, or may be 470 nm or less.

The green semiconductor light-emitting element used together with the blue semiconductor light-emitting element may be a semiconductor light-emitting element that emits light in a green (including blue-green and yellow-green) region. The peak wavelength is usually 490 nm or more, and may be 495 nm or more, and usually 570 nm or less, and may be 560 nm or less.

The red semiconductor light-emitting element used together with the blue semiconductor light-emitting element may be a semiconductor light-emitting element that emits light in a red (including orange) region. The peak wavelength is usually 590 nm or more, and may be 600 nm or more, and is usually 780 nm or less.

The phosphor used together with the semiconductor light emitting element is not particularly limited, and examples thereof include a blue phosphor, a green phosphor, a yellow phosphor, an orange phosphor, and a red phosphor, and these known phosphors can be used.

In the present embodiment, in order to satisfy various conditions, a combination of the phosphors used can be appropriately set, and examples of a preferred embodiment include a form including at least one green phosphor and at least one red phosphor, a form including at least two green phosphors, and a form including at least two types of red phosphors.

Specific examples of the green phosphor used include a green phosphor, of which host is $Ce^{3+}$ activated aluminate, $Ce^{3+}$ activated yttrium-aluminum oxide, $Eu^{2+}$ activated alkaline earth silicate crystals, or $Eu^{2+}$ activated alkaline earth-silicon nitride. These green phosphors can normally be excited using a semiconductor light-emitting element ranging from ultraviolet to blue.

Specific examples of the $Ce^{3+}$ activated aluminate phosphor include a green phosphor represented by the following general formula (II).

$$Y_a(Ce,Tb,Lu)_b(Ga,Sc)_cAl_dO_e \quad (II)$$

(In the general formula (II), a, b, c, d and e satisfy a+b=3, 0≤b≤0.2, 4.5≤c+d≤5.5, 0.1≤c≤2.6, and 10.8≤e≤13.4.)

Note that $Ce^{3+}$ activated aluminate phosphor represented by the general formula (II) is referred to as a G-YAG phosphor.

Specific examples of $Ce^{3+}$ activated yttrium-aluminum oxide phosphor include a green phosphor represented by the following general formula (III).

$$Lu_a(Ce,Tb,Y)_b(Ga,Sc)_cAl_dO_e \quad (III)$$

(In the general formula (3), a, b, c, d, and e satisfy a+b=3, 0≤b≤0.2, 4.5≤c+d≤5.5, 0≤c≤2.6, and 10.8≤e≤13.4.)

Note that, the $Ce^{3+}$ activated yttrium-aluminum oxide phosphor represented by the general formula (III) is called "LuAG phosphor".

Other examples include green phosphors represented by the following general formula (IV) and a phosphor represented by the following general formula (V).

$$M^1_a M^2_b M^3_c O_d \quad \text{(IV)}$$

(in the general formula (IV), $M^1$ indicates a bivalent metallic element, $M^2$ indicates a trivalent metallic element, and $M^3$ indicates a tetravalent metallic element, and a, b, c and d satisfy $2.7 \leq a \leq 3.3$, $1.8 \leq b \leq 2.2$, $2.7 \leq c \leq 3.3$ and $11.0 \leq d \leq 13.0$.)

Note that the phosphor represented by the general formula (IV) is referred to as a CSMS phosphor.

In the above general formula (IV), $M^1$ is a bivalent metallic element, and is preferably at least one type selected from the group consisting of Mg, Ca, Zn, Sr, Cd and Ba, further preferably Mg, Ca or Zn, and particularly preferably Ca. In this case, Ca may be a single system or may be a composite system with Mg. $M^1$ may include other bivalent metallic elements.

$M^2$ is a trivalent metallic element, and is preferably at least one type selected from the group consisting of Al, Sc, Ga, Y, In, La, Gd and Lu, further preferably Al, Sc, Y or Lu, and particularly preferably Sc. In this case, Sc may be a single system or may be a composite system with Y or Lu. $M^2$ must include Ce and may include other trivalent metallic elements.

$M^3$ is a tetravalent metallic element, and preferably includes at least Si. An example of a tetravalent metallic element $M^3$, other than Si, is preferably at least one type selected from the group consisting of Ti, Ge, Zr, Sn and Hf, further preferably at least one type selected from the group consisting of Ti, Zr, Sn and Hf, and particularly preferably Sn. Particularly it is preferable that $M^3$ is Si. $M^3$ may include other tetravalent metallic elements.

The lower limit of the ratio of Ce included in $M^2$ to the entire $M^2$ is preferably 0.01 or more, and more preferably 0.02 or more. Further, the upper limit of the ratio of Ce included in $M^2$ to the entire $M^2$ is preferably 0.10 or less, and more preferably 0.06 or less. Further, the lower limit of the ratio of Mg included in $M^1$ element to the entire $M^1$ is preferably 0.01 or more, and more preferably 0.03 or more. On the other hand, the upper limit is preferably 0.30 or less, and more preferably 0.10 or less.

$$M^1_a M^2_b M^3_c O_d \quad \text{(V)}$$

(In the general formula (V), $M^1$ indicates an activator element including at least Ce, $M^2$ is a bivalent metallic element, and $M^3$ is a trivalent metallic element, and a, b, c and d satisfy $0.0001 \leq a \leq 0.2$, $0.8 \leq b \leq 1.2$, $1.6 \leq c \leq 2.4$ and $3.2 \leq d \leq 4.8$.)

Note that a phosphor represented by the general formula (V) is called "CSO phosphor".

In the above general formula (V), $M^1$ is an activator element contained in a host crystal, and includes at least Ce. $M^1$ can contain at least one type of bivalent to tetravalent element selected from the group consisting of Cr, Mn, Fe, Co, Ni, Cu, Ce, Pr, Nd, Sm, Eu, Tb, Dy, Ho, Er, Tm and Yb.

$M^2$ is a bivalent metallic element, and is preferably at least one type selected from the group consisting of Mg, Ca, Zn, Sr, Cd and Ba, further preferably Mg, Ca or Sr, and is particularly preferably that Ca is 50 mol % or more of the elements of $M^2$.

$M^3$ is a trivalent metallic element, and is preferably at least one type selected from the group consisting of Al, Sc, Ga, Y, In, La, Gd, Yb and Lu, and further preferably Al, Sc, Yb or Lu, more further preferably Sc, or Sc and Al, or Sc and Lu, and is particularly preferably that Sc is 50 mol % or more of the elements of $M^3$.

$M^2$ and $M^3$ are a bivalent metallic element and trivalent metallic element respectively, and a small part of M2 and/or M3 may be a metallic element of which valence is any one of 1, 4 and 5, and a very small amount of anions, such as a halogen element (F, Cl, Br, I), nitrogen, sulfur selenium or the like may be contained in the compound.

Furthermore, specific examples of green phosphors using an alkaline-earth silicate crystal as a host and $Eu^{2+}$ as an activator include a phosphor represented by the following general formula (VI).

$$(Ba_a Ca_b Sr_c Mg_d Eu_x)SiO_4 \quad \text{(VI)}$$

(In the general formula (VI), a, b, c, d, and x satisfy $a+b+c+d+x=2$, $1.0 \leq a \leq 2.0$, $0 \leq b < 0.2$, $0.2 \leq c \leq 1.0$, $0 \leq d < 0.2$, and $0 < x \leq 0.5$.)

Note that alkaline-earth silicate represented by the general formula (VI) is referred to as a BSS phosphor.

Furthermore, specific examples of phosphors using an alkaline-earth nitride silicate crystal as a host and $Eu^{2+}$ as an activator include a green phosphor represented by the following general formula (VII).

$$(Ba,Ca,Sr,Mg,Zn,Eu)_3 Si_6 O_{12} N_2 \quad \text{(VII)}$$

Note that a phosphor represented by the general formula (VII) is referred to as a BSON phosphor.

In the general formula (VII), a combination of Ba, Sr and Eu is preferably among the selectable bivalent metallic elements (Ba, Ca, Sr, Mg, Zn, Eu), and the ratio of Sr to Ba is preferably 10 to 30%.

Still other examples may include a yellow phosphor such as a yttrium aluminum garnet phosphor represented by $(Y_{1-u}Gd_u)_3(Al_{1-v}Ga_v)_5O_{12}$:Ce,Eu (where u and v respectively satisfy $0 \leq u \leq 0.3$ and $0 \leq v \leq 0.5$) (this phosphor is referred to as a YAG phosphor) or a lanthanum silicon nitride phosphor represented by $Ca_{1.5x}La_{3-x}Si_6Ni_{11}$:Ce (where x satisfies $0 \leq x \leq 1$) (this phosphor is referred to as an LSN phosphor.) Furthermore, other examples may include a narrow band green phosphor represented by $Si_{6-z}Al_zO_zN_{8-z}$:Eu (where $0<z<4.2$) having $Eu^{2+}$ activated SiAlON crystal as a host (this phosphor is referred to as a β-SiAlON phosphor).

Specific examples of a red phosphor used include phosphors using $Eu^{2+}$ as an activator and a crystal constituted by alkaline-earth silicon-nitride, a SiAlON, or alkaline-earth silicate as a host. A red phosphor of this type can normally be excited using a semiconductor light-emitting element ranging from ultraviolet to blue.

Specific examples of phosphors using an alkaline-earth silicon-nitride crystal as a host include a phosphor represented by $CaAlSiN_3$:Eu (this phosphor is referred to as a CASN phosphor), a phosphor represented by $(Ca,Sr,Ba,Mg)AlSiN_3$:Eu and/or $(Ca,Sr,Ba)AlSiN_3$:Eu (this phosphor is referred to as a SCASN phosphor), a phosphor represented by $(CaAlSiN_3)_{1-x}(Si_2N_2O)_x$:Eu (where x satisfies $0<x<0.5$) (this phosphor is referred to as a CASON phosphor), a phosphor represented by $(Sr,Ca,Ba)_2Al_xSi_{5-x}O_xN_{8-x}$:Eu (where $0 \leq x \leq 2$), and a phosphor represented by $Eu_y(Sr,Ca,Ba)_{1-y}Al_{1+x}Si_{4-x}O_xN_{7-x}$ (where $0 \leq x < 4$, $0 \leq y < 0.2$).

Other examples include a Me-activated fluoride complex phosphor. A $Mn^{4+}$-activated fluoride complex phosphor is a phosphor which uses $Mn^{4+}$ as an activator and a fluoride complex salt of an alkali metal, amine, or an alkaline-earth metal as a host crystal. Fluoride complex salts which form the host crystal include those whose coordination center is a trivalent metal (B, Al, Ga, In, Y, Sc, or a lanthanoid), a tetravalent metal (Si, Ge, Sn, Ti, Zr, Re, or Hf), and a pentavalent metal (V, P, Nb, or Ta), and the number of fluorine atoms coordinated around the center ranges from 5 to 7.

Specific examples of the Me-activated fluoride complex phosphor include $A_{2+x}M_yMn_zF_n$ (where A is Na and/or K; M is Si and Al; and $-1 \leq x \leq 1$ and $0.9 \leq y+z \leq 1.1$ and $0.001 \leq z \leq 0.4$ and $5 \leq n \leq 7$) which uses a hexafluoro complex of an alkali metal as a host crystal. Among the above, specific examples thereof include phosphors in which A is one or more types selected from K (potassium) or Na (sodium) and M is Si (silicon), Ti (titanium) or Ge (germanium) such as $K_2SiF_6$:Mn (this phosphor is referred to as a KSF phosphor) or $K_2Si_{1-x}Na_xAl_xF_6$:Mn (this phosphor is referred to as a KSNAF phosphor) that is obtained by replacing a part (favorably, 10 mol % or less) of the components of $K_2SiF_6$:Mn with Al and Na.

Other examples include a phosphor represented by the following general formula (VIII) and a phosphor represented by the following general formula (IX).

$$(La_{1-x-y}Eu_xLn_y)_2O_2S \quad\quad\quad (VIII)$$

(In the general formula (VIII), x and y denote numbers respectively satisfying $0.02 \leq x \leq 0.50$ and $0 \leq y \leq 0.50$, and Ln denotes at least one trivalent rare-earth element among Y, Gd, Lu, Sc, Sm, and Er)

Note that a lanthanum oxysulfide phosphor represented by the general formula (VIII) is referred to as an LOS phosphor.

$$(k-x)MgO \cdot xAF_2 \cdot GeO_{2-y}Mn^{4+} \quad\quad\quad (IX)$$

(In the general formula (IX), k, x, and y denote numbers respectively satisfying $2.8 \leq k \leq 5$, $0.1 \leq x \leq 0.7$, and $0.005 \leq y \leq 0.015$, and A is any of calcium (Ca), strontium (Sr), barium (Ba), zinc (Zn), and a mixture consisted of these elements)

Note that a germanate phosphor represented by the general formula (IX) is referred to as an MGOF phosphor.

Various means are conceivable for lowering $D_{uv}$ from zero to set $D_{uv}$ to an appropriate negative value. For example, it is possible to shift the peak wavelength of a blue LED to the short wavelength side in a light-emitting device having the blue LED, it is possible to shift the peak wavelength to the long wavelength side when a red LED or a red phosphor is used, and it is possible to shift the peak wavelength from 555 nm or the like when a green LED or a green phosphor is used. Further, it is possible to increase the relative emission intensity of the blue LED, to increase the relative emission intensity of the red LED or the red phosphor, to reduce the relative emission intensity of the green LED or the green phosphor, or the like. In order to change $D_{uv}$ to the positive side, the operation reverse to the operation described above may be performed.

$\Delta C_n$ (n is an integer from 1 to 15), average thereof, $\Delta C_{12}$, $\Delta C_{14}$, and $\Delta C_{15}$ can be controlled by those skilled in the art by referring to Patent Documents 3 to 5.

In the present embodiment, the correlated color temperature CCT of light emitted from the light-emitting device is not particularly limited, and may be substantially the same value as light emitting-devices in general illumination, and is usually 1600 K or more, may be 2,000 K or more, and may be 2,400 K or more. The temperature is usually 7,000 K or less, may be 6,500 K or less, and may be 6,000 K or less.

The light-emitting device is usually built in a mobile device, and may be mounted in a mobile device as an application. The light-emitting device may have a structure detachable from a mobile device.

Furthermore, the light-emitting device may include a lens such as a Fresnel lens or a reflective frame.

Hereinafter, experiments conducted by the present inventors will be described.

Reference Example 1: Imaging with Digital Camera

Figure 2:
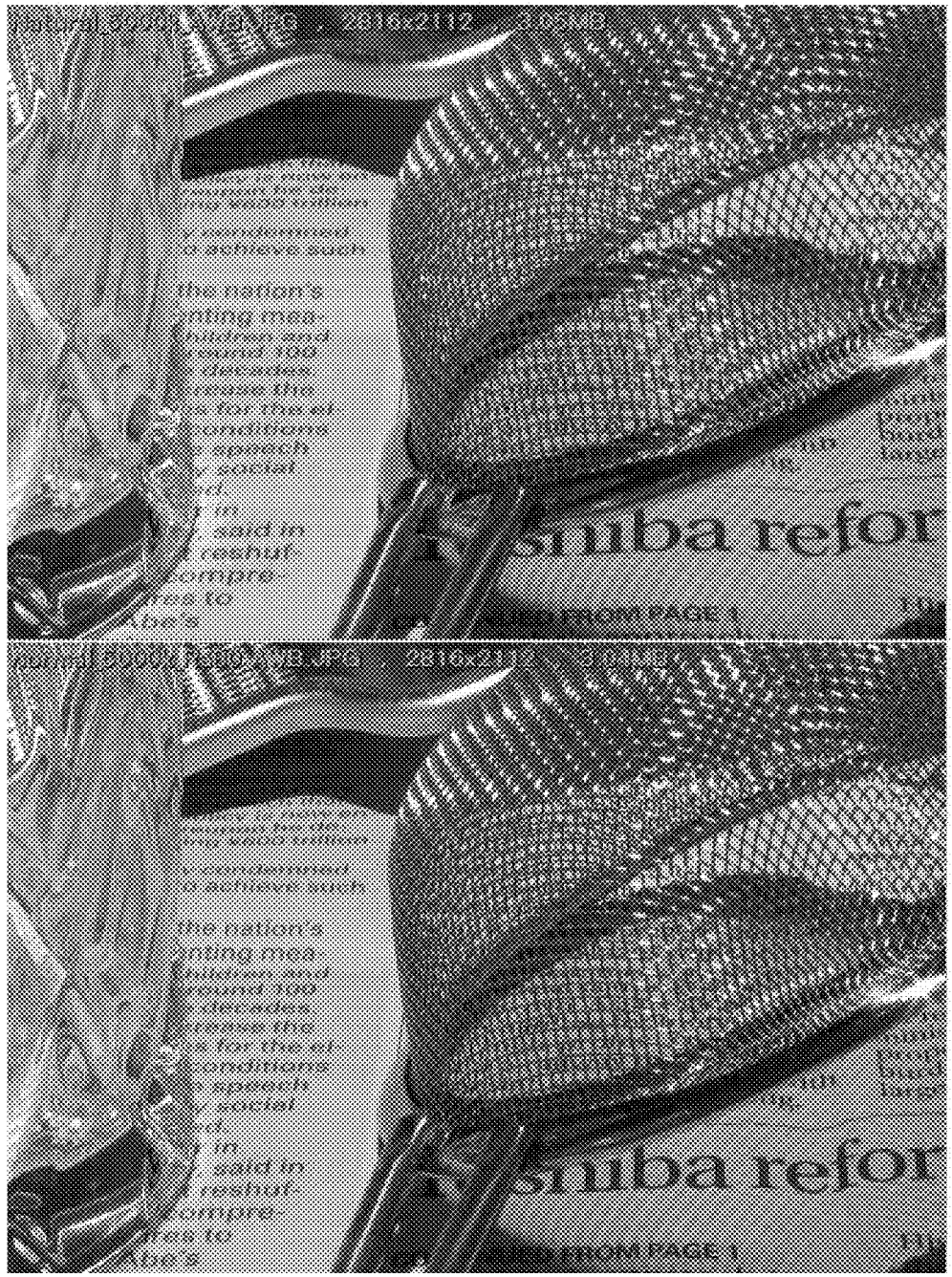
FIG. 2 is images captured by using a comparative reference light source A and a reference light source C (drawing substitute photograph).
Figure 3:
FIG. 3 is images captured by using a comparative reference light source A and a reference light source C (drawing substitute photograph).

Two digital cameras (compact digital camera manufactured by Canon, Powershot G7X) were prepared, and an originally mounted LED light source was replaced with a comparative reference light source A of Ra80, and a reference light source C for the other. In order to match the imaging conditions of both, the "white" settings of both cameras were matched. An image obtained by flash imaging using a digital camera equipped with a comparative reference light source A and an image obtained by flash imaging using a digital camera equipped with a reference light source C were obtained. Comparisons of both images are shown in FIGS. 1 to 3. The image in the upper row in each of the figures is an image using a digital camera equipped with the reference light source C.

From the comparison in FIG. 1, it can be understood that the image obtained by flash imaging with the reference light source C has high transparency.

From the comparison in FIG. 2, it can be understood that the image obtained by flash imaging with the reference light source C has high contrast and resolution.

From the comparison in FIG. 3, it can be understood that the image obtained by flash imaging with the reference light source C has a high stereoscopic effect.

TABLE 1

| Test light source | CCT | $D_{uv}$ | Δ Cn (Max value) | Δ Cn (Min value) | $\Delta C_{ave}$ | Δ Cmax − Δ Cmin | Δ $h_n$ (Max) | Δ $h_n$ (Min) |
|---|---|---|---|---|---|---|---|---|
| Reference light source C | 5438 | −0.0065 | 4.10 | −0.53 | 1.31 | 4.63 | 6.21 | 0.10 |
| Comparative reference light source A | 4998 | 0.0024 | 5.15 | −8.93 | −1.53 | 14.08 | 11.85 | 0.01 |

Reference Example 2: Color Temperature Change with Digital Camera

Figure 4:
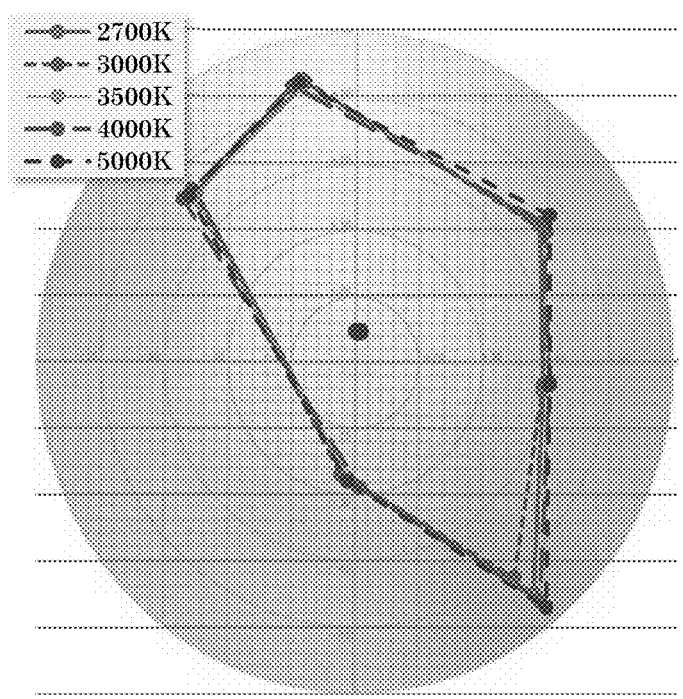
FIG. 4 is a chromaticity diagram of images captured by using a reference light source D (2,700 K, 3,000 K, 3,500 K, 4,000 K, 5,000 K) of different color temperatures in a state in which a "white" setting is fixed.

A reference light source D that is a light source of a digital camera shown in Table 2 below was replaced with a plurality of reference light sources D (color temperatures of 2,700 K, 3,000 K, 3,500 K, 4,000 K, and 5,000 K) of different color temperatures with the "white" setting fixed. FIG. 4 shows a chromaticity diagram of an image obtained by capturing a subject. From FIG. 4, it can be understood that change in the chromaticity of the reference light source D does not occur even when the color temperature is changed, and it is almost unnecessary to change or correct the setting of the firmware. In the reference light source D, the value of $D_{uv}$, the value of $\Delta C_n$, and the like are substantially the same at each color temperature.

Figure 5:
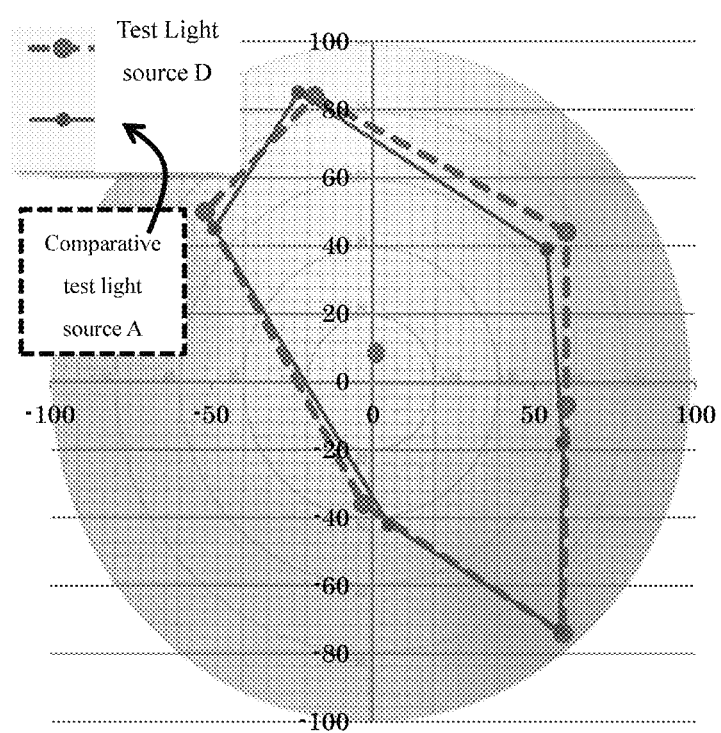
FIG. 5 is a chromaticity diagram of images captured by using a comparative reference light source A light source and a reference light source D in a state in which a "white" setting is fixed.

The reference light source D that is a light source of a digital camera was replaced with a comparative reference light source A with the "white" setting fixed. FIG. 5 shows the chromaticity diagram of an image obtained by capturing a subject. From FIG. 5, it can be understood that when the reference light source D is replaced with a comparative reference light source, the chromaticity changes greatly, and therefore, it is necessary to change or correct the setting of the firmware.

TABLE 2

| Test light source | CCT | $D_{uv}$ | Δ Cn (Max value) | Δ Cn (Min value) | $\Delta C_{ave}$ | Δ Cmax − Δ Cmin | Δ $h_n$ (Max) | Δ $h_n$ (Min) |
|---|---|---|---|---|---|---|---|---|
| Reference light source D | 4979 | −0.0069 | 5.91 | −0.18 | 1.94 | 6.08 | 6.37 | 0.01 |

Experimental Example. Preparation of Light Source

Figure 8:
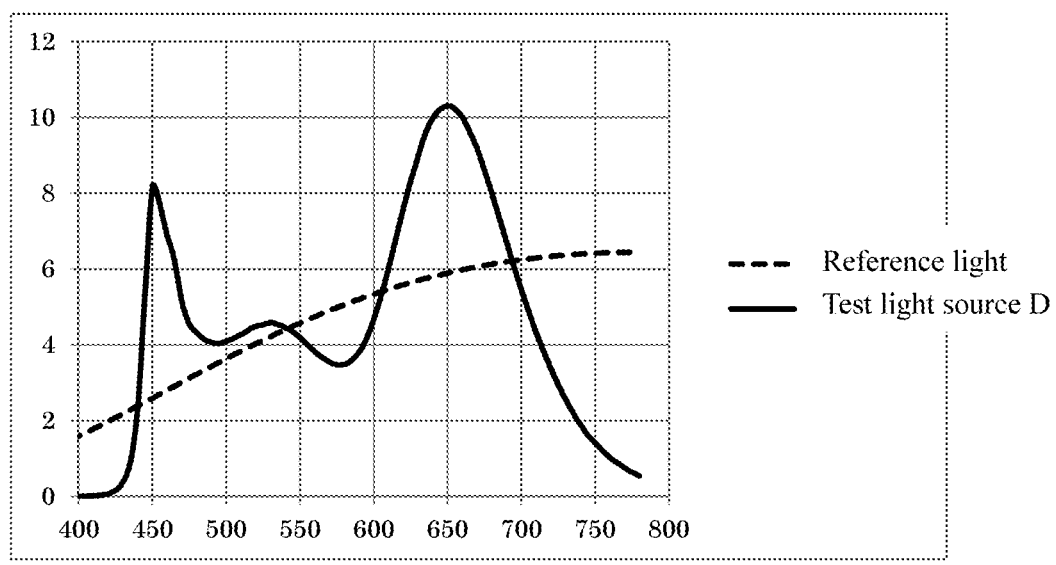
FIG. 8 shows a spectrum diagram of light emitted from a test light source D.

A plurality of LEDs to be mounted on a digital camera (compact digital camera Powershot G7X manufactured by Canon) were prepared. Table 3 and Table 4 show various values calculated from the spectral power distribution spectrum of light emitted from the LED. The spectrum of light emitted from a test light source D is shown in FIG. 8.

TABLE 3

| Light source | ΔS (540-610) | ΔS (610-680) | B | ΔS (580) | CCT (K) | Ra |
|---|---|---|---|---|---|---|
| Comparative test light source A | −47.7 | 169.3 | 217.0 | −0.736 | 5013 | 63 |
| Comparative test light source B | −29.7 | 130.7 | 160.4 | −0.612 | 4969 | 82 |
| Comparative test light source C | −16.7 | 70.2 | 86.9 | −0.206 | 5024 | 92 |
| Test light source A | −3.2 | −11.5 | −8.4 | 0.117 | 5228 | 96 |
| Test light source B | 13.3 | −87.2 | −100.5 | 0.604 | 5229 | 88 |
| Test light source C | −2.2 | 4.2 | 6.4 | 0.144 | 4219 | 94 |
| Test light source D | 60.7 | −224.9 | −285.6 | 1.571 | 3702 | 65 |
| Test light source E | −2.8 | 19.8 | 22.6 | 0.118 | 4905 | 93 |
| Test light source F | −6.8 | 27.2 | 34.0 | 0.069 | 5456 | 90 |
| Test light source G | −2.4 | 8.1 | 10.5 | 0.123 | 4894 | 93 |
| Test light source H | −7.2 | 0.0 | 7.2 | 0.057 | 5317 | 92 |
| Test light source I | −11.1 | 7.5 | 18.6 | 0.002 | 5594 | 86 |

TABLE 4

| Light source | $D_{uv}$ | $\Delta C_n$ (max) | $\Delta C_n$ (min) | $\Delta C_{ave}$ | ΔCmax − ΔCmin | $\Delta h_n$ (max) | $\Delta h_n$ (min) |
|---|---|---|---|---|---|---|---|
| Comparative test light source A | 0.0112 | 9.18 | −14.94 | −1.43 | 24.12 | 16.91 | 1.95 |
| Comparative test light source B | 0.0027 | 4.02 | −9.35 | −1.17 | 13.37 | 8.58 | 0.26 |
| Comparative test light source C | 0.0020 | 3.61 | −4.07 | −0.47 | 7.68 | 7.34 | 0.05 |
| Test light source A | −0.0046 | 3.79 | −0.87 | 1.28 | 4.66 | 5.79 | 0.05 |
| Test light source B | −0.0073 | 6.13 | 0.06 | 2.53 | 6.07 | 5.83 | 0.28 |
| Test light source C | −0.0078 | 5.11 | −1.65 | 1.70 | 6.76 | 6.46 | 0.25 |
| Test light source D | −0.0229 | 12.91 | 0.26 | 6.07 | 12.65 | 11.53 | 1.17 |
| Test light source E | 0.0001 | 3.08 | −2.07 | 0.57 | 5.15 | 5.58 | 0.02 |
| Test light source F | 0.0016 | 4.07 | −2.47 | 0.84 | 6.55 | 6.29 | 0.47 |
| Test light source G | −0.0035 | 4.33 | −1.95 | 1.24 | 6.28 | 6.10 | 0.18 |
| Test light source H | −0.0064 | 5.69 | −1.85 | 1.96 | 7.54 | 7.27 | 0.09 |
| Test light source I | −0.0071 | 7.56 | −3.21 | 2.47 | 10.77 | 8.43 | 0.32 |

A digital camera (compact digital camera Powershot G7X manufactured by Canon) was prepared, and the comparative test light sources A to C and the test light sources A to I were each mounted. In order to match the imaging conditions of the respective digital cameras, the "white" setting of each camera was made the same. In all of the digital cameras equipped with the test light sources A to I, images with favorable color reproducibility of a subject, clarity of the boundary line of each subject, and the like were obtained.

Figure 6:
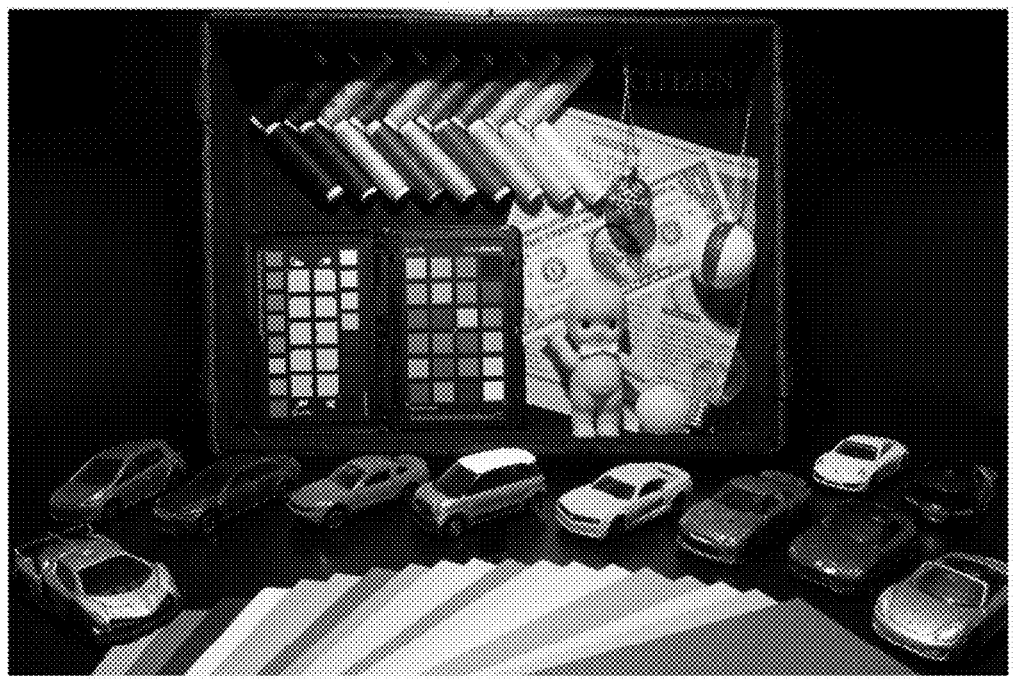
FIG. 6 shows a photograph taken by a digital camera equipped with a comparative test light source B (drawing substitute photograph).
Figure 7:
FIG. 7 shows a photograph taken by a digital camera equipped with a test light source A (drawing substitute photograph).

On the other hand, in all of the digital cameras equipped with the comparative test light sources A to C, an image inferior in color reproducibility and remarkable dullness was obtained. FIGS. 6 and 7 show an image obtained by flash imaging using a digital camera equipped with a comparative test light source B and an image obtained by flash imaging using a digital camera equipped with a test light source A.

The test light sources A to I from which an image with favorable color reproducibility of a subject, clarity of the boundary line of each subject, or the like was obtained had a spectral power distribution spectrum whose emission intensity was lower than that of the reference light corresponding to the correlated color temperature at a wavelength of 580 nm, and the B value indicating the relationship with the reference light corresponding to the correlated color temperature in the wavelength range from 540 nm to 610 nm and the wavelength range from 610 nm to 680 nm was 65 or less. Further, ΔS (540 to 610) representing the relationship between the reference light corresponding to a correlated color temperature in a region where green and red overlap each other was −15 or more for any test light source, and ΔS (610 to 680) representing the relationship with the reference light corresponding to a correlated color temperature in a red region was 50 or less for any test light source.

In this way, by suppressing the light emission intensity of light emitted from the light-emitting device in an overlap region between a green peak and a red peak of a camera sensor, it was possible to achieve both sensitivity improvement and color reproducibility which are in a trade-off relationship. In the red region, the color reproducibility was improved by relatively increasing the emission intensity of light emitted from the light-emitting device.

<Experiment Using Wavelength Control Element>

Figure 9A:
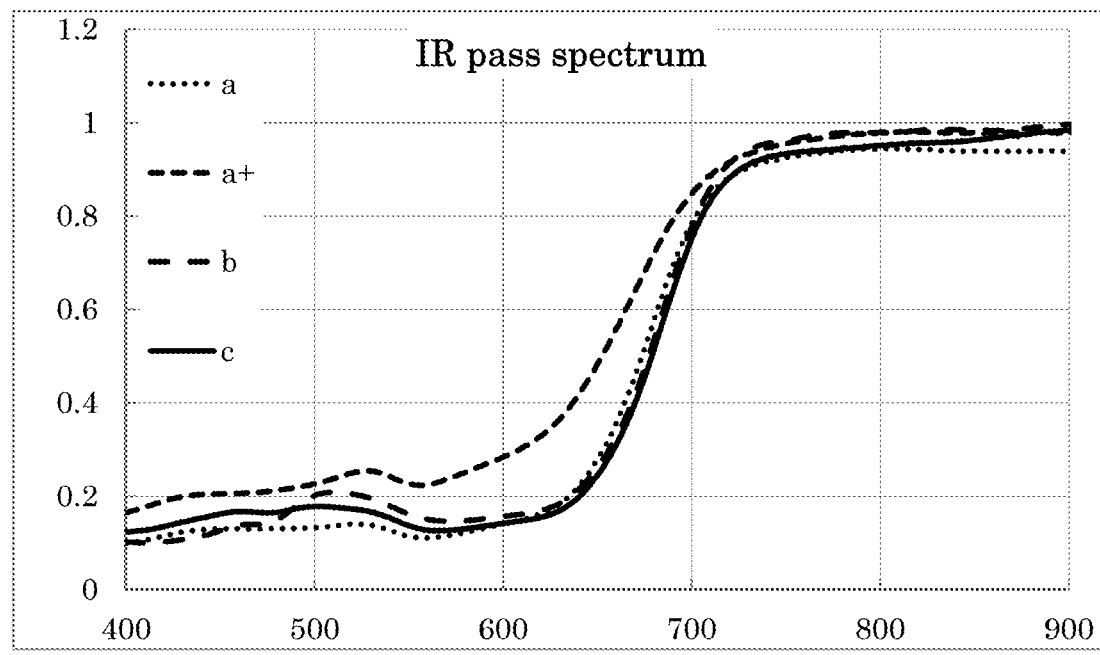
FIG. 9A shows a transmission spectrum of a filter used in an experiment.
Figure 9B:
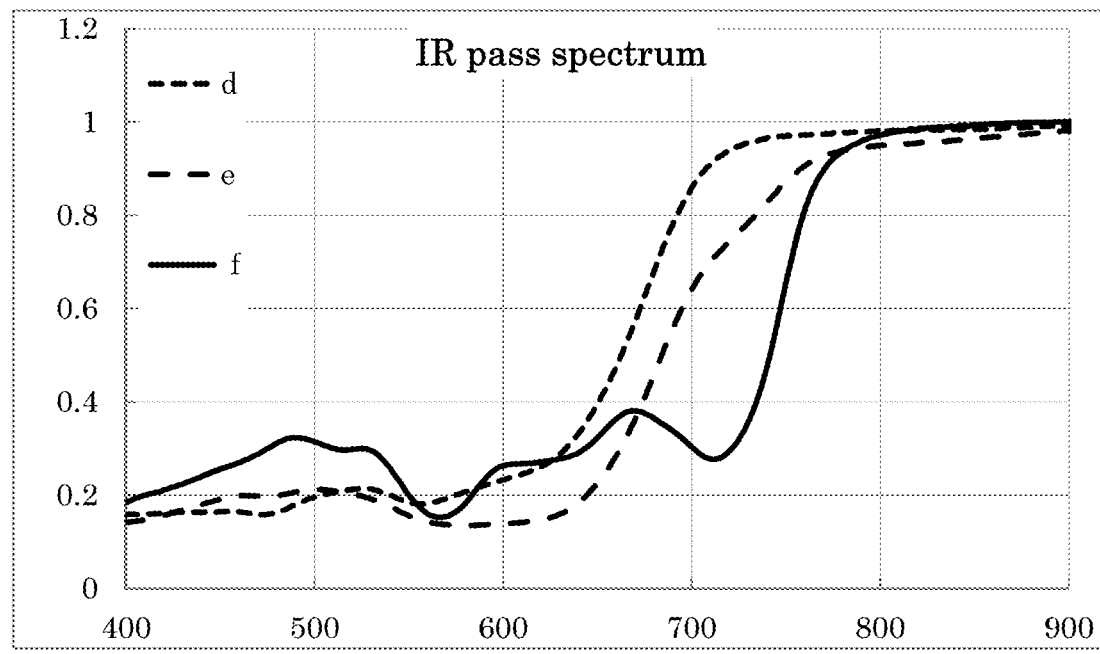
FIG. 9B shows a transmission spectrum of a filter used in an experiment.
Figure 10:
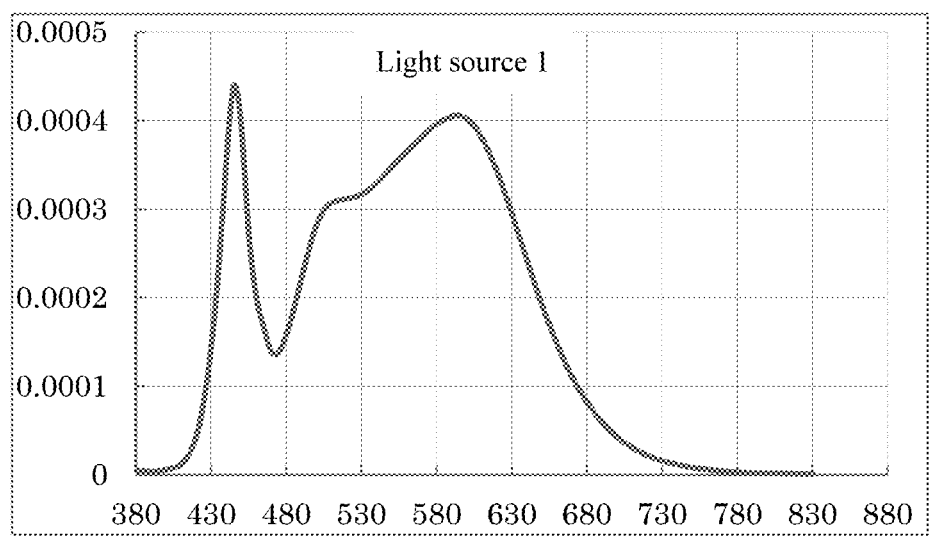
FIG. 10 shows the spectrum of light emitted from a light source 1 used in an experiment.
Figure 12:
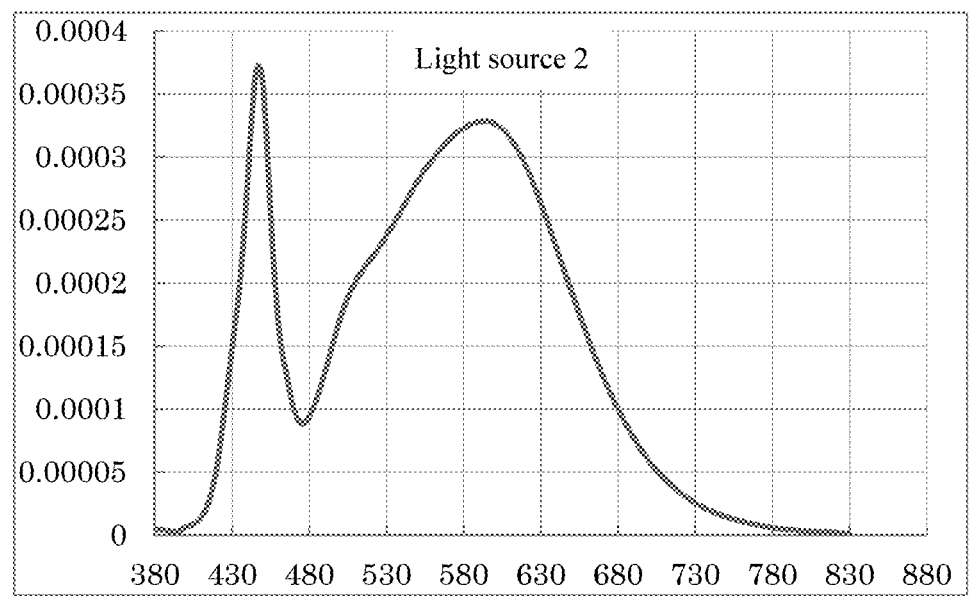
FIG. 12 shows the spectrum of light emitted from a light source 2 used in an experiment.
Figure 14:
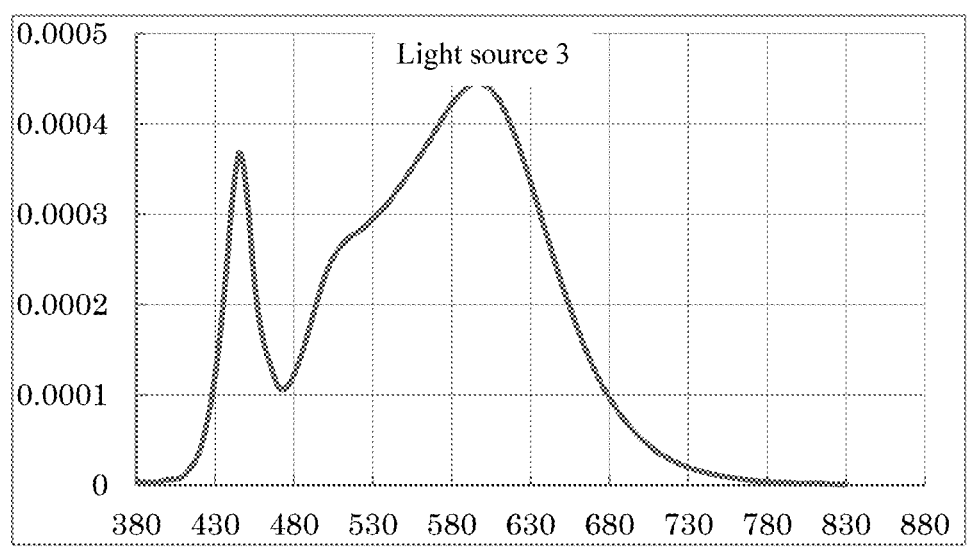
FIG. 14 shows the spectrum of light emitted from a light source 3 used in an experiment.
Figure 16:
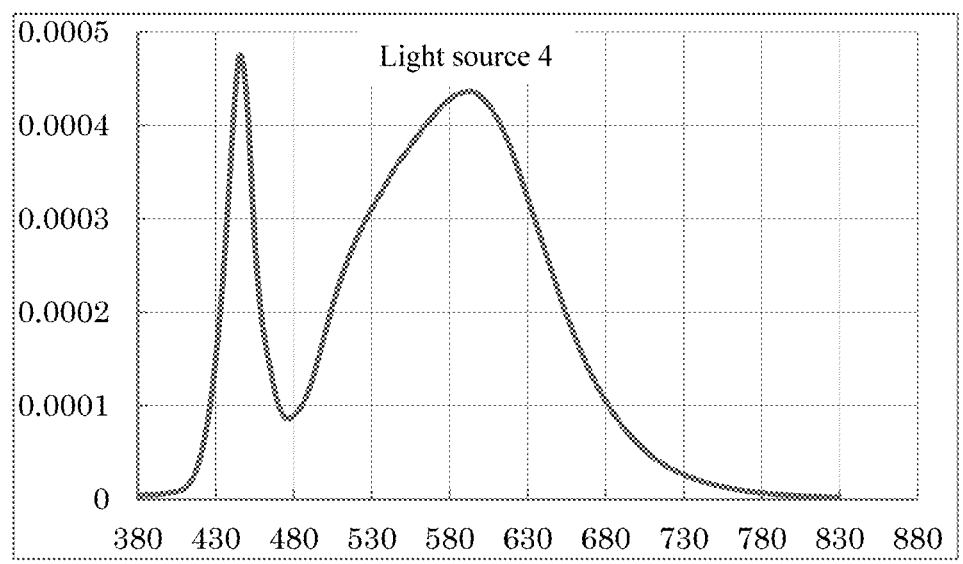
FIG. 16 shows the spectrum of light emitted from a light source 4 used in an experiment.
Figure 18:
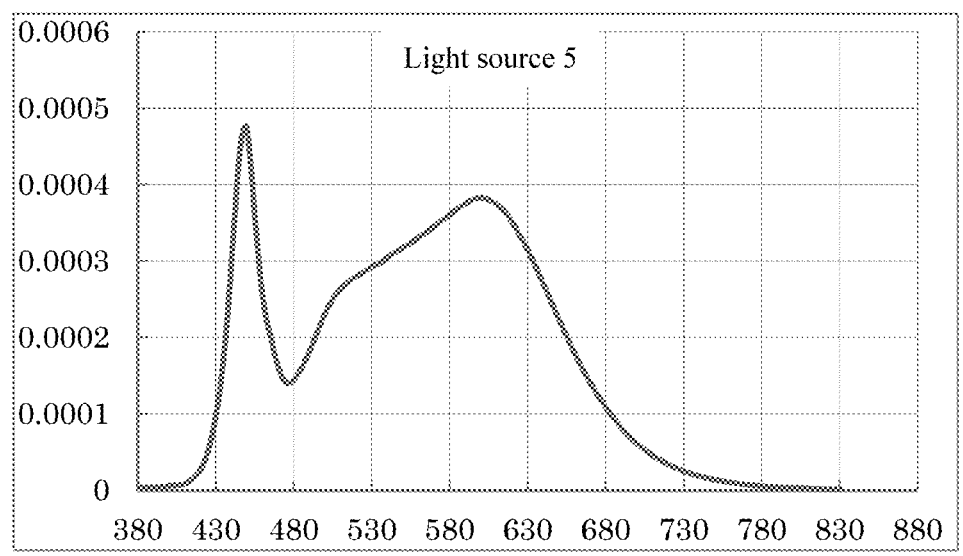
FIG. 18 shows the spectrum of light emitted from a light source 5 used in an experiment.
Figure 20:
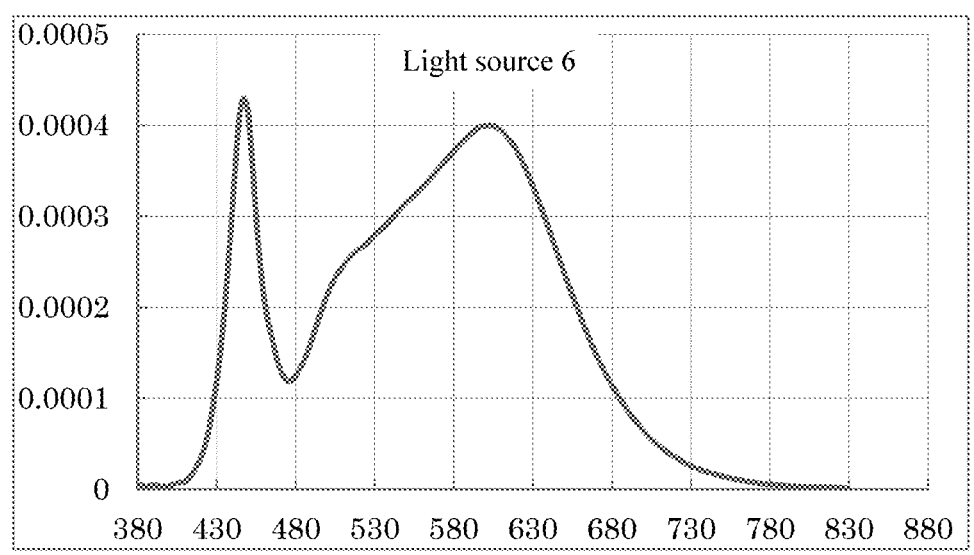
FIG. 20 shows the spectrum of light emitted from a light source 6 used in an experiment.
Figure 22:
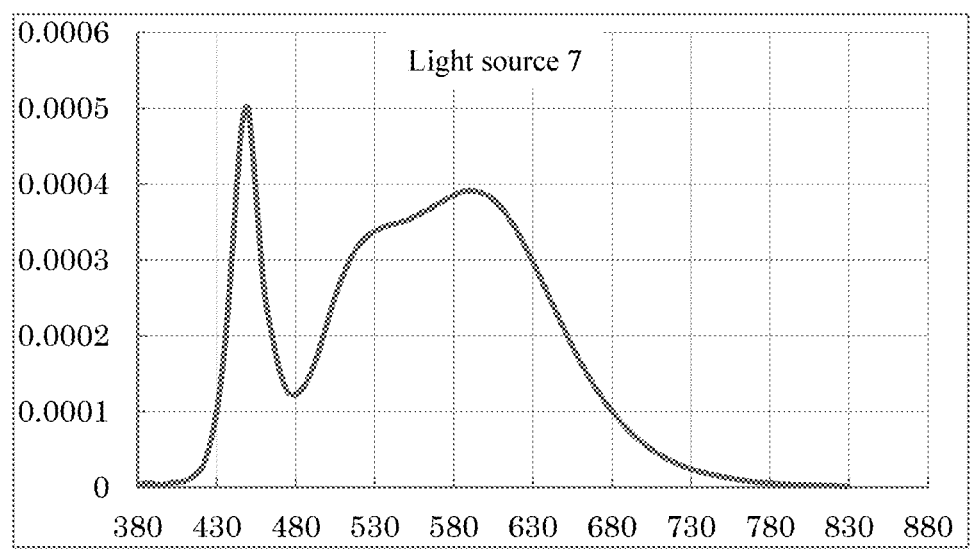
FIG. 22 shows the spectrum of light emitted from a light source 7 used in an experiment.
Figure 24:
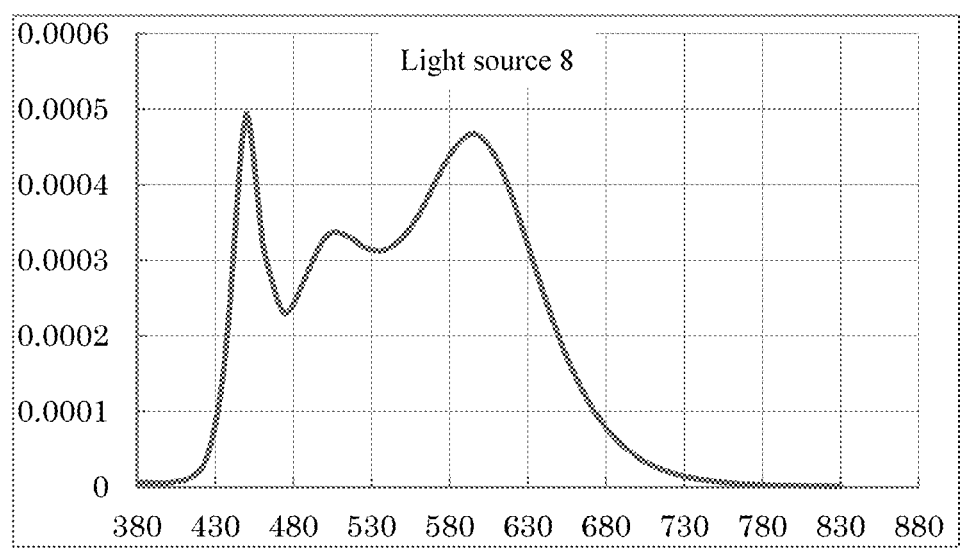
FIG. 24 shows the spectrum of light emitted from a light source 8 used in an experiment.
Figure 26:
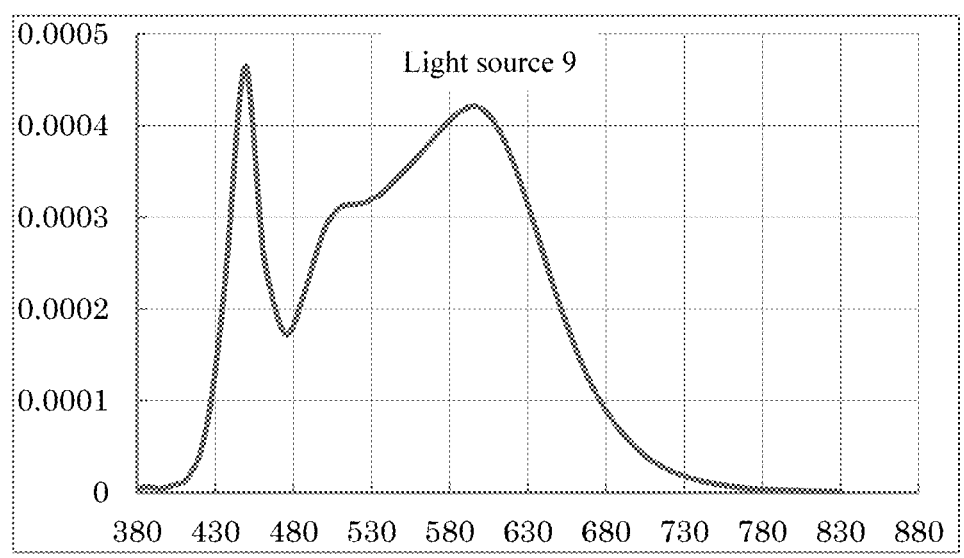
FIG. 26 shows the spectrum of light emitted from a light source 9 used in an experiment.
Figure 28:
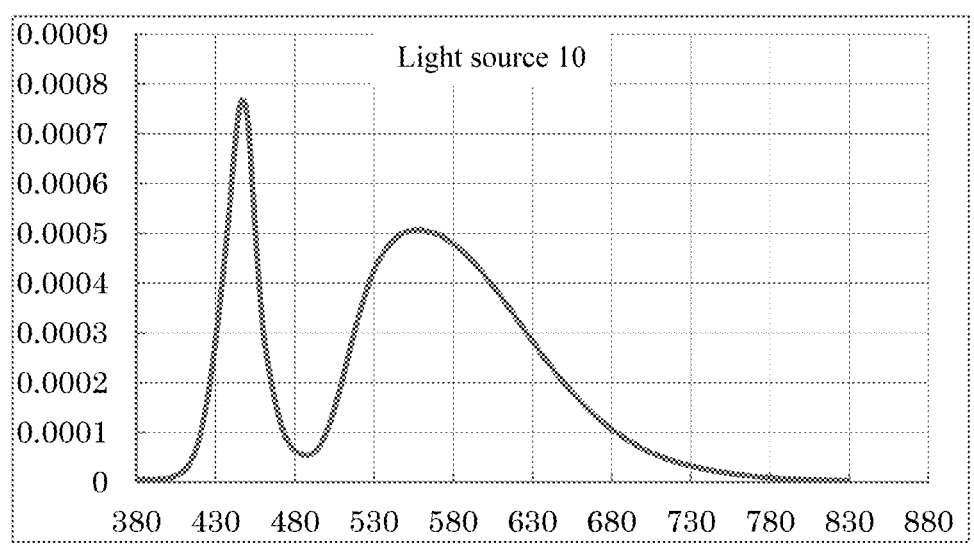
FIG. 28 shows the spectrum of light emitted from a light source 10 used in an experiment.
Figure 30:
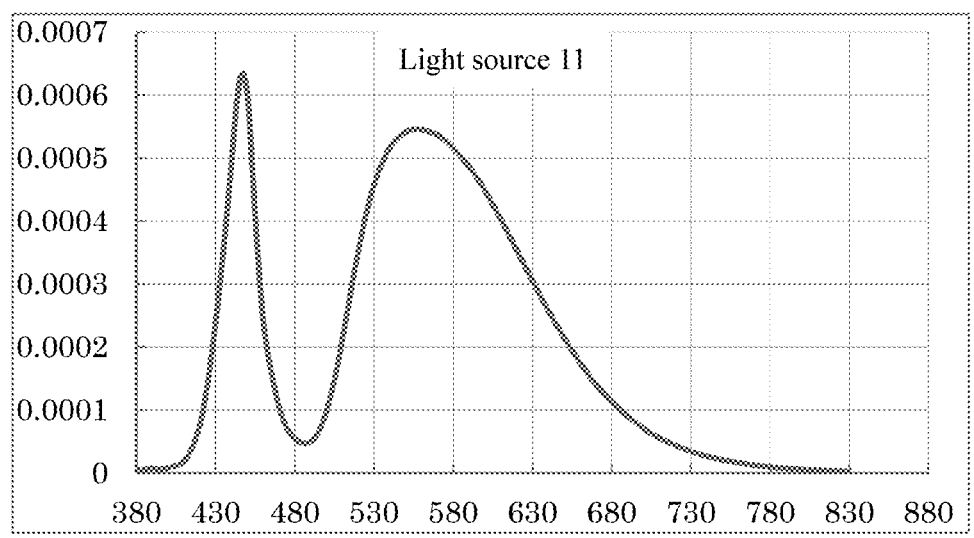
FIG. 30 shows the spectrum of light emitted from a light source 11 used in an experiment.
Figure 32:
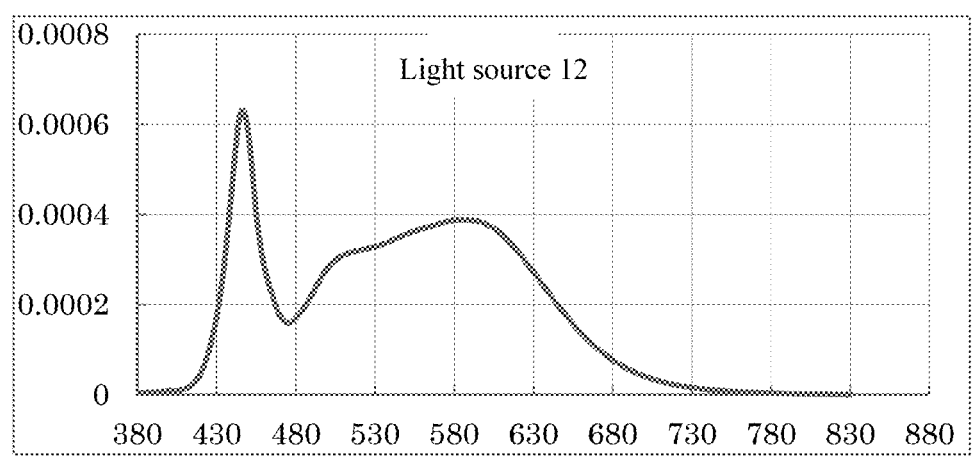
FIG. 32 shows the spectrum of light emitted from a light source 12 used in an experiment.

Seven kinds of filters having transmission spectra shown in FIGS. 9A and 9B were prepared. Next, 12 types of light sources from a light source 1 to a light source 12 for emitting light of the spectra shown in FIGS. 10, 12, 14, 16, 18, 20, 22, 24, 26, 28, 30, and 32 were prepared. Seven kinds of filters were sequentially applied to 12 kinds of light sources, and how the spectrum of light emitted from each light source changed and how the appearance of the light changed were observed. The results are shown in FIGS. 11, 13, 15, 17, 19, 21, 23, 25, 27, 29, 31, and 33, respectively.

Sensory evaluation was performed on how the appearance of an image taken with a digital camera (compact digital camera Powershot G7X manufactured by Canon) changed before and after application of a filter. An image captured with a digital camera equipped with each light-emitting device and filter was prepared, and a sensory evaluation was carried out by evaluating the image by a panelist. Evaluation as to whether or not the appearance of an image was improved by the presence or absence of a filter was performed by "○" or "X", and the degree of improvement was evaluated in 5 grades for a case where the evaluation was "○". Table 5 shows combinations in which the improvement evaluation result was "○" and the degree of improvement was 5, Table 6 shows combinations in which the improvement evaluation result was "○" and the degree of improvement was 4 or 3, Table 7 shows combinations in which the improvement evaluation result was "○" and the degree of improvement was 2 or 1, and Table 8 shows the combinations in which the improvement evaluation result was "x".

TABLE 5

Combination of evaluation 5

| Light source | | Filter |
|---|---|---|
| 1 | x | a |
| 1 | x | f |
| 2 | x | a |
| 2 | x | d |
| 2 | x | e |
| 2 | x | f |
| 3 | x | a |

TABLE 5-continued

Combination of evaluation 5

| Light source | | Filter |
|---|---|---|
| 3 | x | c |
| 3 | x | f |
| 4 | x | c |
| 4 | x | f |
| 5 | x | a |
| 5 | x | a+ |
| 5 | x | c |
| 5 | x | d |
| 5 | x | e |
| 5 | x | f |
| 6 | x | a |
| 6 | x | c |
| 6 | x | d |
| 6 | x | e |
| 6 | x | f |
| 7 | x | a |
| 7 | x | c |
| 7 | x | f |
| 8 | x | a |
| 8 | x | c |
| 9 | x | a |
| 9 | x | c |
| 9 | x | f |
| 12 | x | a |
| 12 | x | c |
| 12 | x | d |
| 12 | x | f |

TABLE 6

Combination of evaluation 3, 4

| Light source | | Filter |
|---|---|---|
| 1 | x | a+ |
| 1 | x | c |
| 2 | x | a+ |
| 2 | x | c |
| 3 | x | a+ |
| 3 | x | d |
| 3 | x | e |
| 4 | x | a |
| 4 | x | a+ |
| 4 | x | d |
| 4 | x | e |
| 5 | x | b |
| 6 | x | a+ |
| 7 | x | a+ |
| 7 | x | d |
| 8 | x | a+ |
| 8 | x | d |
| 8 | x | f |
| 9 | x | a+ |
| 9 | x | d |
| 9 | x | e |
| 10 | x | c |
| 12 | x | a+ |

TABLE 7

Combination of evaluation 1, 2

| Light source | | Filter |
|---|---|---|
| 1 | x | b |
| 1 | x | d |
| 1 | x | e |
| 2 | x | b |

TABLE 7-continued

Combination of evaluation 1, 2

| Light source | | Filter |
|---|---|---|
| 6 | x | b |
| 7 | x | b |
| 7 | x | e |
| 8 | x | e |
| 9 | x | b |
| 10 | x | f |
| 12 | x | b |
| 12 | | e |

TABLE 8

Combination of evaluation "x"

| Light source | | Filter |
|---|---|---|
| 3 | x | b |
| 4 | x | b |
| 8 | x | b |
| 10 | x | a |
| 10 | x | a+ |
| 10 | x | b |
| 10 | x | d |
| 10 | x | e |
| 11 | x | a |
| 11 | x | a+ |
| 11 | x | b |
| 11 | x | c |
| 11 | x | d |
| 11 | x | e |
| 11 | x | f |

Based on these experimental results, the present inventors considered as follows.

<Discussion 1: $\Delta C_n$ (n is a natural number from 1 to 15) and average of $\Delta C_n$>

Regarding the light sources 10 and 11, there was a tendency that an image was not improved or the evaluation result was lowered irrespective of which type of filter was used. In the light sources 10 and 11, the Ra was low, and, in the first place, the value of $\Delta C_{14}$ was low. Therefore, although the value of $\Delta C_{14}$ was improved by using a filter, the value was still low, and it was considered that the captured image was not improved.

Many of those evaluated that the captured image was not improved had an evaluation such as looking greenish overall, or looking dull in the skin color. In the captured image having such evaluation, the values of $\Delta C_8$ and $\Delta C_9$ of light through a filter were high. On the other hand, even if the value of $\Delta C_8$ and the value of $\Delta C_9$ were high, in a case in which the saturation difference $\Delta C_n$ (n is a natural number from 1 to 15) and the average thereof fall within appropriate ranges, improvement in the captured image was observed, and therefore, such a case was considered to be one of conditions for making the color reproducibility of a captured image or the like favorable when a filter was provided.

<Discussion 2: Regarding Value of $D_{uv}$>

When a filter capable of shifting the value of $D_{uv}$ negatively was combined with a light source, there was a tendency to improve the captured image. On the other hand, although a b filter and an e filter tended to shift the $D_{uv}$ value positively as a whole, even when such a filter is used, when the $D_{uv}$ value of light emitted through the filter falls within an appropriate range, improvement of a captured image was observed. Note that there was a combination such as light source 10× filter e, or light source 8× filter b in which image improvement was not seen even though the $D_{uv}$ value of light emitted through a filter was within an appropriate range. This is considered to be because the saturation difference $\Delta C_n$ (n is a natural number from 1 to 15) or the average value thereof did not satisfy appropriate ranges (from −5.0 to 15.0, from −0.6 to 6.0, respectively).

<Discussion 3: Regarding Value of $\Delta C_{14}$>

Although when the value of $\Delta C_{14}$ of light emitted through a filter was too low, no image improvement was observed, it was found from the result of the light source 10× filter c that even if the saturation difference $\Delta C_n$ (n is a natural number from 1 to 15) did not satisfy a range considered appropriate, the degree of improvement was high when the value of $D_{uv}$ was appropriate, the average value of $\Delta C_n$ was appropriate, and the value of $\Delta C_{14}$ was −5.0 or more. However, even in such a case, it is assumed that the value of $\Delta C_n$ should not fall below −7.0.

<Discussion 4: Regarding B Value, $\Delta S$ (580 nm)>

Even when the value of $D_{uv}$, the saturation difference $\Delta C_n$ (n was a natural number from 1 to 15), and the average value thereof were out of an appropriate range, if the B value of light emitted through a filter and the value of $\Delta S$ (580 nm) was appropriate, the captured image was improved.

<Discussion 5: Regarding $\Delta hn$>

When the hue angle difference $\Delta hn$ of light emitted through a filter was 13° or less, the color reproducibility of a captured image was further improved.

<Discussion 6: Regarding Value of $\Delta C_{12}$>

When the value of $\Delta C_{12}$ was −0.5 or more, the color reproducibility of a captured image was further improved. When the ratio between the increment of the value of $\Delta C_{12}$ and the increment of the value of $\Delta C_{14}$ was in an appropriate range, the color reproducibility of a captured image was further improved.

Below is a list of requirements for obtaining a favorable captured image that could be found from experimental results.

$D_{uv}$ of outgoing light emitted from a filter is declined.

The average $\Delta C_n$ (n is any integer from 1 to 15) of the outgoing light emitted from a filter is increased.

The shape of the spectrum of the outgoing light emitted from a filter has a bottom peak (downwardly convex peak) in the region from 510 nm to 590 nm.

In the spectral shape of the outgoing light emitted from a filter, the wavelength representing the top peak shifts to a long wavelength side in the region from 580 nm to 780 nm, and the half width of the top peak is large.

$\Delta C_{14}$ of the outgoing light emitted from a filter is increased, and is preferably increased by 4 or more.

$\Delta C_{14}$ and $\Delta C_{12}$ of the outgoing light emitted from a filter are changed in such a manner that the absolute value of the increase amount of $\Delta C_{14}/\Delta C_{12}$ is 1 or more.

$\Delta C_{15}$ of the outgoing light emitted from a filter is increased, and is preferably increased by 3 or more.

The absolute value $|\Delta h_n|$ of the hue angle difference of the outgoing light emitted from a filter is reduced.

What is claimed is:

1. A mobile device comprising: at least an imaging element; and a light-emitting device that irradiates a subject in accordance with imaging of the imaging element, wherein
the light-emitting device comprises a semiconductor light-emitting element, and
if a spectral power distribution of light emitted from the light-emitting device is denoted by $\varphi_{SSL}(\lambda)$,
a spectral power distribution of a reference light that is selected according to a correlated color temperature $T_{SSL}(K)$ of the light emitted from the light-emitting device is denoted by $\varphi_{ref}(\lambda)$, tristimulus values of the light emitted from the light-emitting device are denoted by $(X_{SSL}, Y_{SSL}, Z_{SSL})$, and tristimulus values of the reference light that is selected according to the correlated color temperature $T_{SSL}(K)$ of the light emitted from the light-emitting device are denoted by $(X_{ref}, Y_{ref}, Z_{ref})$, and if a normalized spectral power distribution $S_{SSL}(\lambda)$ of light emitted from the light-emitting device, a normalized spectral power distribution $S_{ref}(\lambda)$ of a reference light that is selected according to the correlated color temperature $T_{SSL}(K)$ of the light emitted from the light-emitting device, and a difference $\Delta S(\lambda)$ between these normalized spectral power distributions are respectively defined as $S_{SSL}(\lambda)=\varphi_{SSL}(\lambda)/Y_{SSL}$,
$S_{ref}(\lambda)=\varphi_{ref}(\lambda)/Y_{ref}$ and
$\Delta S(\lambda)=S_{ref}(\lambda)-S_{SSL}(\lambda)$, the difference $\Delta S(580)$ of the normalized spectral power distribution at a wavelength of 580 nm is larger than zero, and a value B representing a difference between normalized spectral power distributions in a wavelength range from 540 nm to 610 nm and a wavelength range from 610 nm to 680 mu represented by the following Formula (1) is 65 or less $$B=\int_{540}^{610}-\Delta S(\lambda)d\lambda+\int_{610}^{680}-\Delta S(\lambda)d\lambda \quad (1)$$

2. A mobile device comprising: at least an imaging element; and a light-emitting device that irradiates a subject in accordance with imaging of the imaging element, wherein the light-emitting device comprises a semiconductor light-emitting element, and if a spectral power distribution of light emitted from the light-emitting device is denoted by $\varphi_{SSL}(\lambda)$, a spectral power distribution of a reference light that is selected according to the correlated color temperature $T_{SSL}(K)$ of the light emitted from the light-emitting device is denoted by $\varphi_{ref}(\lambda)$, tristimulus values of the light emitted from the light-emitting device are denoted by $(X_{SSL}, Y_{SSL}, Z_{SSL})$, and tristimulus values of the reference light that is selected according to the correlated color temperature $T_{SSL}(K)$ of the light emitted from the light-emitting device are denoted by $(X_{ref}, Y_{ref}, Z_{ref})$, and if a normalized spectral power distribution $S_{SSL}(\lambda)$ of light emitted from the light-emitting device, a normalized spectral power distribution $S_{ref}(\lambda)$ of a reference light that is selected according to the correlated color temperature $T_{SSL}(K)$ of the light emitted from the light-emitting device, and a difference $\Delta S(\lambda)$ between these normalized spectral power distributions are respectively defined as $S_{SSL}(\lambda)=\varphi_{SSL}(\lambda)/Y_{SSL}$,
$S_{ref}(\lambda)=\varphi_{ref}(\lambda)/Y_{ref}$ and
$\Delta S(\lambda)=S_{ref}(\lambda)-S_{SSL}(\lambda)$, the difference $\Delta S(580)$ of the normalized spectral power distribution at a wavelength of 580 nm is larger than zero, the difference $\Delta S$ (from 540 to 610) of the normalized spectral power distribution in the wavelength range from 540 nm to 610 nm represented by the following Formula (2) is −15 or more, and the difference $\Delta S$ (from 610 to 680) of the normalized spectral power distribution in the wavelength range from 610 nm to 680 nm represented by the following Formula (3) is 50 or less $$\Delta S(540\sim610)=\int_{540}^{610}\Delta S(\lambda)d\lambda \quad (2)$$

$$\Delta S(610\sim680)=\int_{610}^{680}\Delta S(\lambda)d\lambda \quad (3)$$

3. The mobile device according to claim 1, wherein a Delta uv (Duv) of the light-emitting device is from −0.04 to 0.002.

4. The mobile device according to claim 1, wherein irradiation of a subject by the light-emitting device is for 0.5 seconds or less.

5. The mobile device according to claim 1, wherein light emitted from the light-emitting device satisfies the following Conditions I to IV;

Condition I:

If an a* value and a h* value in CIE 1976 L*a*b* color space of 15 Munsell renotation color samples from #01 to #15 listed below when mathematically assuming illumination by the light emitted from the light-emitting device are respectively denoted by $a^*_{nSSL}$ and $b^*_{nSSL}$, where n is a natural number from 1 to 15, and if an a* value and a b* value in CIE 1976 L*a*b* color space of the 15 Munsell renotation color samples when mathematically assuming illumination by a reference light that is selected according to the correlated color temperature $T_{SSL}$, (K) of the light emitted are respectively denoted by $a^*_{nref}$ and $b^*_{nref}$, where n is a natural number from 1 to 15, then each saturation difference $\Delta C_n$ satisfies $-4.0 \leq \Delta C_n \leq 18.6$, where n is a natural number from 1 to 15, Condition II:

The average of $\Delta C_n$, n is an integer from 1 to 15, is from 0 to 7.0,

Condition III

The difference between the maximum value and the minimum value of the $\Delta C_n$, n is any integer from 1 to 15, is 2.0 or more and 19.6 or less, where $\Delta C_n = \sqrt{\{(a^*_{nSSL})^2+(b^*_{nSSL})^2\}} - \sqrt{\{(a^*_{nref})^2+(b^*_{nref})^2\}}$, with the 15 Munsell renotation color samples being:
01 7.5P 4/10
02 10PB 4/10
03 5PB 4/12
04 7.5B 5/10
05 10BG 6/8
06 2.5BG 6/10
07 2.5G 6/12
08 7.5GY 7/10
09 2.5GY 8/10
10 5Y 8.5/12
11 10YR 7/12
12 5YR 7/12
13 10R 6/12
14 5R 4/14
15 7.5RP 4/12

Condition IV:

If hue angles in CIE 1976 L*a*b* color space of the 15 Munsell renotation color samples when mathematically assuming illumination by light emitted from the light-emitting device are denoted by $\theta_{nSSL}$ (degrees), where n is a natural number from 1 to 15, and if hue angles in a CIE 1976 L*a*b* color space of the 15 Munsell renotation color samples when mathematically assuming illumination by a reference light that is selected according to the correlated color temperature $T_{SSL}$ (K) of light emitted are denoted by $\theta_{nref}$(degrees), where n is a natural number from 1 to 15, then an absolute value of each difference in hue angles $|\Delta h_n|$ satisfies $0 \le |\Delta h_n| \le 12.5$ (degree), where n is a natural number from 1 to 15, where $\Delta h_n = \theta_{nSSL} - \theta_{nref}$.

6. A mobile device comprising: at least an imaging element; a light-emitting device that irradiates a subject in accordance with imaging of the imaging element; and a wavelength control element arranged on a subject side of the light-emitting device, wherein the light-emitting device comprises a semiconductor light-emitting element, and if a spectral power distribution of light emitted from the light-emitting device through the wavelength control element is denoted by $\varphi_{SSL}(\lambda)$, a spectral power distribution of a reference light that is selected according to the correlated color temperature $T_{SSL}$(K) of the light emitted from the light-emitting device through the wavelength control element is denoted by $\varphi_{ref}(\lambda)$, tristimulus values of the light emitted from the light-emitting device through the wavelength control element are denoted by $(X_{SSL}, Y_{SSL}, Z_{SSL})$, and tristimulus values of the reference light that is selected according to the correlated color temperature $T_{SSL}$(K) of the light emitted from the light-emitting device through the wavelength control element are denoted by $(X_{ref}, Y_{ref}, Z_{ref})$, and if a normalized spectral power distribution $S_{SSL}(\lambda)$ of light emitted from the light-emitting device through the wavelength control element, a normalized spectral power distribution $S_{ref}(\lambda)$ of a reference light that is selected according to the correlated color temperature $T_{SSL}$(K) of the light emitted from the light-emitting device through the wavelength control element, and a difference $\Delta S(\lambda)$ between these normalized spectral power distributions are respectively defined as $S_{SSL}(\lambda) = \varphi_{SSL}(\lambda)/Y_{SSL}$,
$S_{ref}(\lambda) = \varphi_{ref}(\lambda)/Y_{ref}$, and
$\Delta S(\lambda) = S_{ref}(\lambda) - S_{SSL}(\lambda)$, and at least one of the following Condition X, Condition Y, and Condition Z is satisfied;

Condition X:

$D_{uv}$ is from −0.04 to 0.01, if an a* value and a b* value in CIE 1976 L*a*b* color space of 15 Munsell renotation color samples from #01 to #15 listed below when mathematically assuming illumination by the light emitted from the light-emitting device through a wavelength control element in the radiant direction are respectively denoted by $a^*_{nSSL}$ and $b^*_{SSL}$, where n is a natural number from 1 to 15, and if an a* value and a b* value in CIE 1976 L*a*b* color space of the 15 Munsell renotation color samples when mathematically assuming illumination by a reference light that is selected according to the correlated color temperature $T_{SSL}$(K) of the light emitted in the radiant direction are respectively denoted by $a^*_{nref}$ and $b^*_{nref}$, where n is a natural number from 1 to 15, then each saturation difference $\Delta C$ is from −5.0 to 15.0, and an average of the $\Delta C_n$, is any integer from 1 to 15, is from −0.6 to 6.0, Condition Y:

the difference $\Delta S(580)$ of the normalized spectral power distribution at a wavelength of 580 nm is larger than zero, and a value B representing a difference between normalized spectral power distributions in a wavelength range from 540 nm to 610 nm and a wavelength range from 610 nm to 680 nm represented by the following Formula (1) is 65 or less $$B = \int_{540}^{610} -\Delta S(\lambda) d\lambda + \int_{610}^{680} -\Delta S(\lambda) d\lambda \tag{1}$$

Condition Z:

$D_{uv}$ is from −0.04 to 0.01, if an a* value and a b* value in CIE 1976 L*a*b* color space of 15 Munsell renotation color samples from #01 to #15 listed below when mathematically assuming ilhuination by the light emitted from the light-emitting device through a wavelength control element in the radiant direction are respectively denoted by $a^*_{nSSL}$ and $b^*_{nSSL}$, where n is a natural number from 1 to 15, and if an a* value and a b* value in CIE 1976 L*a*b* color space of the 15 Munsell renotation color samples when mathematically assuming illumination by a reference light that is selected according to the correlated color temperature $T_{SSL}$(K) of the light emitted in the radiant direction are respectively denoted by $a^*_{nref}$ and $b^*_{nref}$, where n is a natural number from 1 to 15, then each saturation difference $\Delta C$ is from −7.0 to 15.0, an average of the $\Delta C_n$, is any integer from 1 to 15, is from −0.6 to 6.0, and $\Delta C_{14}$ is from −5.0 to 15.

7. The mobile device according to claim 2, wherein the Duv of the light-emitting device is from −0.04 to 0.002.

8. The mobile device according to claim 2, wherein irradiation of a subject by the light-emitting device is for 0.5 seconds or less.

9. The mobile device according to claim 2, wherein light emitted from the light-emitting device satisfies the following Conditions I to IV;

Condition I:

If an a* value and a b* value in CIE 1976 L*a*b* color space of 15 Munsell renotation color samples from #01 to #15 listed below when mathematically assuming illumination by the light emitted from the light-emitting device are respectively denoted by $a^*_{nSSL}$ and $b^*_{nSSL}$, where n is a natural number from 1 to 15, and if an a* value and a b value in CIE 1976 L*a*b* color space of the 15 Munsell renotation color samples when mathematically assuming illumination by a reference light that is selected according to the correlated color temperature $T_{SSL}$(K) of the light emitted are respectively denoted by $a^*_{nref}$ and $b^*_{nref}$, where n is a natural number from 1 to 15, then each saturation difference $\Delta C_n$ satisfies $-4.0 \le \Delta C_n \le 18.6$, where n is a natural number from 1 to 15, Condition II:

The average of $\Delta C_n$, is an integer from 1 to 15, is from 0 to 7.0,

Condition III:

The difference between the maximum value and the minimum value of the $\Delta C_n$, n is any integer from 1 to 15, is 2.0 or more and 19.6 or less, where $\Delta C_n = \sqrt{\{(a^*_{nSSL})^2 + (b^*_{nSSL})^2\}} - \sqrt{\{(a^*_{nref})^2 + (b^*_{nref})^2\}}$, with the 15 Munsell renotation color samples being:

| #01 | 7.5P | 4/10 |
| #02 | 10PB | 4/10 |
| #03 | 5PB | 4/12 |
| #04 | 7.5B | 5/10 |

-continued

| | | |
|---|---|---|
| #05 | 10BG | 6/8 |
| #06 | 2.5BG | 6/10 |
| #07 | 2.5G | 6/12 |
| #08 | 7.5GY | 7/10 |
| #09 | 2.5GY | 8/10 |
| #10 | 5Y | 8.5/12 |
| #11 | 10YR | 7/12 |
| #12 | 5YR | 7/12 |
| #13 | 10R | 6/12 |
| #14 | 5R | 4/14 |
| #15 | 7.5RP | 4/12 |

Condition IV:

If hue angles in CIE 1976 L*a*b* color space of the 15 Munsell renotation color samples when mathematically assuming illumination by light emitted from the light-emitting device are denoted by $\theta_{nSSL}$ (degrees), where n is a natural number from 1 to 15, and if hue angles in a CIE 1976 L*a*b* color space of the 15 Munsell renotation color samples when mathematically assuming illumination by a reference light that is selected according to the correlated color temperature $T_{SSL}(K)$ of light emitted are denoted by $\theta_{nref}$(degrees), where n is a natural number from 1 to 15, then an absolute value of each difference in hue angles $|\Delta h_n|$ satisfies $0 \leq |\Delta h_n| \leq 12.5$ (degree), where n is a natural number from 1 to 15, where $\Delta h_n = \theta_{nSSL} - \theta_{nref}$.

* * * * *